(12) United States Patent
Sakano

(10) Patent No.: US 7,303,932 B2
(45) Date of Patent: Dec. 4, 2007

(54) SUPPORT BODY FOR SEMICONDUCTOR ELEMENT, METHOD FOR MANUFACTURING THE SAME AND SEMICONDUCTOR DEVICE

(75) Inventor: Kensho Sakano, Anan (JP)

(73) Assignee: Nichia Corporation, Tokushima (JP)

( * ) Notice: Subject to any disclaimer, the term of this patent is extended or adjusted under 35 U.S.C. 154(b) by 166 days.

(21) Appl. No.: 10/974,889

(22) Filed: Oct. 28, 2004

(65) Prior Publication Data

US 2005/0093146 A1    May 5, 2005

(30) Foreign Application Priority Data

Oct. 30, 2003  (JP)  ............................. 2003-370001
Oct. 7, 2004   (JP)  ............................. 2004-295058

(51) Int. Cl.
*H01L 21/66*   (2006.01)
*H05K 11/14*   (2006.01)
*H05K 1/00*    (2006.01)

(52) U.S. Cl. ............... 438/33; 438/68; 438/FOR. 386; 257/E21.599; 361/736; 174/250

(58) Field of Classification Search .............. 257/678, 257/700, E21.596, E21.599; 438/33, 68, 438/FOR. 386; 361/736, 728; 174/250, 174/260

See application file for complete search history.

(56) References Cited

U.S. PATENT DOCUMENTS

| | | | | |
|---|---|---|---|---|
| 6,621,010 B2 * | 9/2003 | Sakai et al. | ................. | 174/255 |
| 6,727,111 B2 * | 4/2004 | Tsukada | ...................... | 438/33 |
| 6,751,101 B2 * | 6/2004 | Sakai | ......................... | 361/736 |
| 6,760,227 B2 * | 7/2004 | Sakai et al. | ................. | 361/736 |
| 7,091,581 B1 * | 8/2006 | McLellan et al. | ........... | 257/673 |
| 7,112,470 B2 * | 9/2006 | Daubenspeck et al. | ..... | 438/113 |
| 7,122,489 B2 * | 10/2006 | Cheng et al. | ........ | 258/E21.596 |
| 2002/0094607 A1* | 7/2002 | Gebauer et al. | ............ | 438/114 |
| 2005/0151247 A1* | 7/2005 | Nagano et al. | ............. | 257/724 |

FOREIGN PATENT DOCUMENTS

| | | |
|---|---|---|
| JP | 52-058468 | 5/1977 |
| JP | 63-229797 | 9/1988 |
| JP | 02-036094 | 2/1990 |
| JP | 07-040296 | 2/1995 |
| JP | 2003-036094 | 2/2003 |

* cited by examiner

*Primary Examiner*—Howard Weiss
*Assistant Examiner*—Shrinivas H. Rao
(74) *Attorney, Agent, or Firm*—Wenderoth, Lind & Ponack, L.L.P.

(57) ABSTRACT

A semiconductor device comprises a semiconductor element and a support body made of a stack of ceramic layers having a recess in which electrical conductors are electrically connected with the semiconductor element, wherein at least a part of a top face of a recess side wall is covered by a resin, thereby providing a light emitting device.

20 Claims, 10 Drawing Sheets

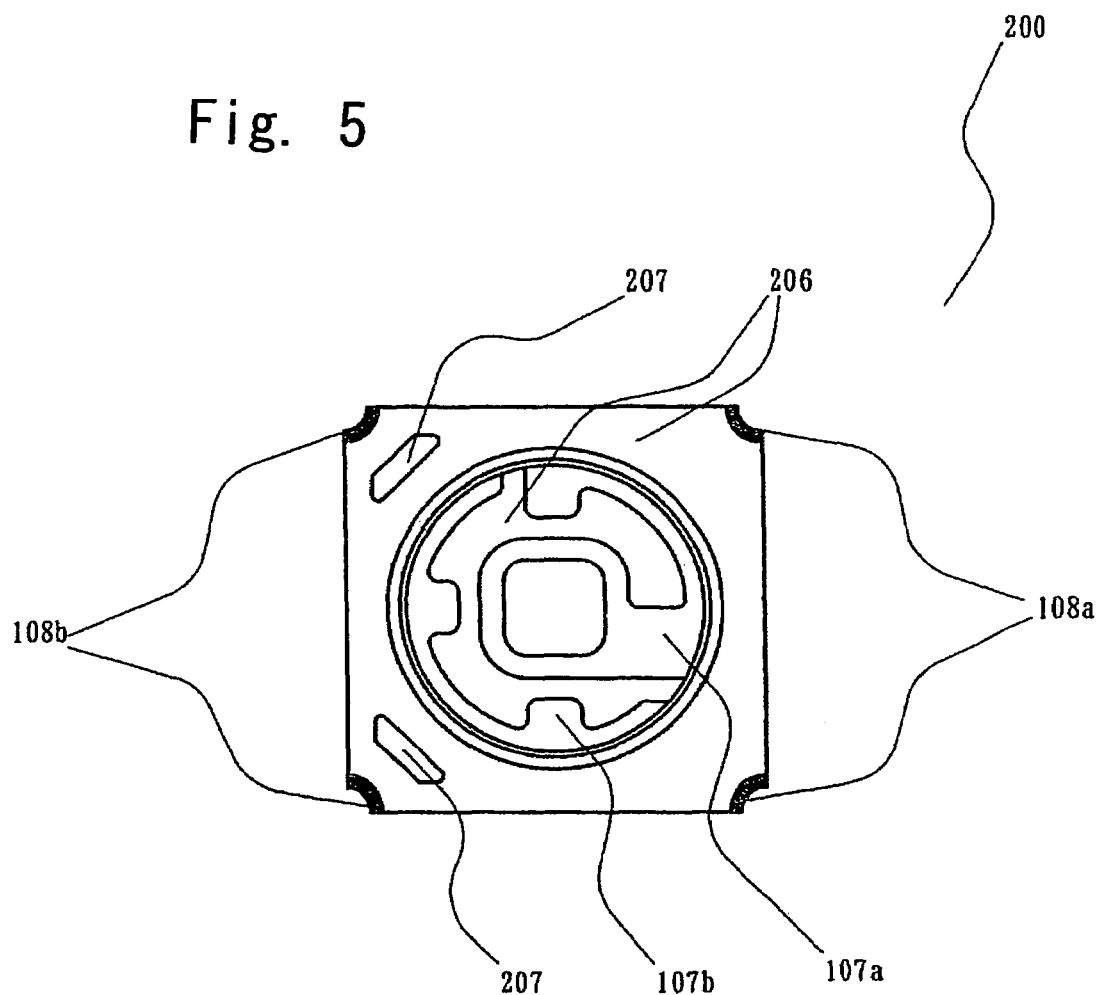

SUPPORT BODY FOR SEMICONDUCTOR ELEMENT, METHOD FOR MANUFACTURING THE SAME AND SEMICONDUCTOR DEVICE

BACKGROUND OF THE INVENTION

1. Field of the Invention

The present invention relates to a method of manufacturing a support body made of ceramic whereon a semiconductor element, particularly a semiconductor light emitting element can be mounted, and to a semiconductor device that employs the support body made of ceramic.

2. Description of the Related Art

A support body made of ceramic for mounting a semiconductor element has been manufactured by stacking ceramic layers that have not yet been fired, called ceramic green sheets, forming through holes in this stack, making electrical wiring to connect the semiconductor element, and firing the stack. At a time when the ceramic green sheets have been stacked, cleaving lines are drawn so the stack of ceramic green sheets that has been fired can be cleaved by applying a force in a particular direction and separated into individual ceramic packages (refer, for example, to Patent Document 1).

The support body made of ceramic is superior in terms of heat dissipation and heat resistance than packages made of plastic, and enables to be made a light emitting device capable of emitting light of high luminance over a long period of time when a semiconductor light emitting element is mounted thereon. This makes it possible to use the light emitting device as alight source of backlight for a liquid crystal display, and demands are increasing for thinner and smaller light emitting devices. One of such light emitting devices that satisfy this demand is a sideways emission type light emitting device (refer, for example, to Patent Document 2). The sideways emission type light emitting device is mounted and connected to a substrate having an electrically conductive wiring pattern by soldering, after undergoing a process called reflow, so that light is emitted along an optical axis substantially parallel to a mounting surface thereof.

[Patent Document 1]

Japanese Unexamined Patent Publication (Kokai) No. 52-58468

[Patent Document 2]

Japanese Unexamined Patent Publication (Kokai) No. 2003-168824

However, since a support body made of ceramic used in the sideways emission type light emitting device described above is made by firing a stack of ceramic green sheets in mass production, a cleavage surface of this ceramic stack formed when separating it into individual support bodies made of ceramic must be used as a mounting surface for the light emitting device. This results in problems including the following major ones: (1) burrs and/or chippings are caused when cleaving the stack into individual support bodies; (2) cleavage surfaces cannot be made invariably smooth because burrs and chippings generated in a cleavage surface differ from chip to chip; and (3) an angle between the cleavage surface and a light emitting surface differ from chip to chip. The cleavage surface having such problems as described above causes variability in optical characteristics of the device when the light emitting device is mounted on a circuit board to make an optical device.

The support body made of ceramic used to make the sideways emission type light emitting device as described above has electrical wiring formed on a mounting surface thereof adjacent to the a emitting surface. Moreover, the electrical wiring is connected to an electrical circuit formed on an external circuit board by soldering, so as to provide mechanical and electrical connection between the light emitting device and the external circuit board. However, there occur such problems as a part of the light emitting surface is covered by solder during a reflow process and/or short-circuiting occurs as solder lines, which should be separated as positive and negative polarities in a circuit, are brought into contact with each other, thus making it impossible to make light emitting devices of high reliability. When a quantity of solder used is decreased, sufficient electrical and mechanical connection may not be achieved between the light emitting device and an external circuit board. A possibility that the problems described above occur becomes higher when the support body is made of ceramic than when it is made of plastic, and higher when the support body is smaller.

SUMMARY OF THE INVENTION

Thus, an object of the present invention is to provide a method of manufacturing a support body made of ceramic, particularly a support body made of ceramic used in a sideways emission type light emitting device, especially a manufacturing method that does not generate burrs or chippings in a cleavage surface. Another object is to provide a light emitting device of high reliability by using the support body made of ceramic.

The present invention provides a support body on which a semiconductor element can be mounted, that is made by separating a ceramic substrate whereon electrical conductors are disposed, wherein a side face of the support body has an incised portion located on a side where a semiconductor element is to be mounted, and a portion cleaved substantially at right angles to the incised portion by applying a bending moment and a tensile force substantially simultaneously to the ceramic substrate, while a polished portion is in a range from ¼ to ¾ a thickness of the ceramic substrate. The incised portion is more preferably in a range from approximately 1/20 to 3/20 of the thickness of the ceramic substrate. A bending moment and a tensile force that are applied substantially simultaneously mean a sequence of actions for separating the substrate and does not mean exactly simultaneous actions.

In the portion cleaved substantially at right angles, it is preferable that a protruded portion protruding out from a vertical face extending vertically from the incised portion toward an opposite side to a side to be mounted with the semiconductor element are at most half of the thickness of the ceramic substrate in the portion cleaved substantially at right angles.

The support body preferably has a recess in which a semiconductor element is placed, and an electrical conductor is disposed either in a part of the recess or the recess in its entirety.

A side face of the support body preferably has a metal disposed at least on one of corners so as to extend from the surface where the semiconductor element is mounted to a back surface.

The present invention relates to a semiconductor device comprising a semiconductor element and the support body whereon the semiconductor element is mounted.

It is preferable that the support body has a recess in which a semiconductor element is placed, and the electrical conductor is disposed in a part of the recess, while the side face of the support body has a metal disposed at least on one of the corners so as to extend from the surface where the semiconductor element is mounted to the back surface, and the recess and top face of a recess side wall are covered with a resin.

The top face of the recess side wall is preferably covered with a resin in a portion of a ceramic base.

Inside of the recess and the top face of the recess side wall are preferably impregnated with a resin in a portion where the ceramic base is exposed.

The present invention relates to a method of manufacturing the support body whereon a semiconductor element can be mounted, comprising processes of: making a ceramic substrate by stacking ceramic sheets with electrical conductors disposed thereon; incising the ceramic substrate, thereby forming a groove; and cleaving the ceramic substrate along the groove, wherein the ceramic substrate is cleaved by applying a bending moment and a tensile force to the ceramic substrate.

The bending moment is preferably applied by bringing a cleaving tool into contact with a surface opposite to the surface having the groove of the ceramic substrate at a position corresponding to the groove.

The ceramic substrate may also be preferably cleaved by applying a bending moment in such a manner as the substrate becomes concave on the side thereof where the groove is formed so that opposing top edges of recess side walls make contact with each other.

Grooves of the ceramic substrate may also be formed in longitudinal and lateral directions on a front surface, while through holes may be made at intersections of these longitudinal and lateral grooves, with the through holes filled with a metallic material to make electrical conductors.

The ceramic substrate may also be provided with a plurality of through holes along which grooves are drawn on a surface of the ceramic substrate.

The ceramic substrate is fired to form a groove after incising the ceramic substrate to a depth in a range from ¼ to ¾ thickness of the ceramic substrate.

Such a process may also be employed as ceramic sheets having electrical conductors disposed thereon are stacked one on another to form a ceramic substrate having a recess formed therein, which is cleaved along grooves drawn along side walls of the recess, thereby making a support body that has electrical conductors exposed on a cleavage surface and in the recess.

In the semiconductor device comprising the semiconductor element and the support body made of a stack of ceramic layers having a recess wherein electrical conductors are electrically connected with a semiconductor element, at least a part of the top face of a recess side wall is preferably covered by a resin.

The resin may also be caused to further impregnate a ceramic base portion of the side wall of the recess.

It is preferable that the semiconductor element is coated with the resin, and a part of the resin is disposed to extend over a top face of the recess side wall.

The resin preferably contains at least one kind of fluorescent material selected from among a fluorescent material that contains Al and at least one element selected from among Y, Lu, Sc, La, Gd, Tb, Eu, Ga, In and Sm, and is activated with at least one element selected from among rare earth elements, and a fluorescent material that contains N, at least one element selected from among Be, Mg, Ca, Sr, Ba and Zn and at least one element selected from among C, Si, Ge, Sn, Ti, Zr and Hf, and is activated with at least one element selected from among rare earth elements.

EFFECT OF THE INVENTION

The present invention provides a support body on which a semiconductor element can be mounted, that is made by separating a ceramic substrate whereon conductors are disposed, wherein a side face of the support body has an incised portion located on a side where the semiconductor element is to be mounted, and a portion cleaved substantially at right angles to the incised portion by applying a bending moment and a tensile force substantially simultaneously to the ceramic substrate, while the incised portion is in a range from ¼ to ¾ a thickness of the ceramic substrate. With this constitution, a surface whereon the semiconductor element is to be mounted has a uniform size because it is separated by grooves. Also, because the bending moment and the tensile force are applied substantially simultaneously, the support body can be made relatively easily without causing burrs or chippings in a cleavage surface. Keeping the incised portion small enables it to be held while the support body is allowed to have a large surface area on a side where the semiconductor element is mounted. In case a light emitting element is used for the semiconductor element, the light emitting device constituted by using the support body made of ceramic enables to be made an optical apparatus by mounting the semiconductor device on a circuit board without causing variability in optical characteristics.

In the portion cleaved substantially at right angles, it is preferable that a protruded portion, protruding from a vertical face extending vertically from the incised portion toward an opposite side to the side to be mounted with the semiconductor element, is at most half of the thickness of the ceramic substrate in the portion cleaved substantially at right angles. In a sideways emission type light emitting device in which the support body is used, if the protruded portion is at most half of the thickness of the ceramic substrate, a tilt on mounting is at most 30 degrees. It is preferable that a protruded portion protruding out side is at most one quarter of the thickness of the ceramic substrate. With this, a tilt on mounting is at most 15 degrees. It is more preferable that the protruded portion protruding out side is at most ¹/₁₀ of the thickness of the ceramic substrate. With this, a constant emitting angle is kept without notice of the tilt on mounting. A dent portion denting inside within about at most one half of the thickness of the ceramic substrate may be allowed since the dent portion does not affect the tilt on mounting. However, from a viewpoint of productivity, a depth of the dent portion is preferably at most one quarter of the thickness of the ceramic substrate, more preferably at most ¹/₁₀ of the thickness of the ceramic substrate.

The support body has a recess for placing a semiconductor element therein, and an electrical conductor is preferably disposed in a part of the recess or in the entire recess. This enables the electrical conductor to electrically connect with the semiconductor element. It is also made possible to electrically connect outside electrodes and the support body.

The side face of the support body preferably has a metal disposed at least on one of the corners so as to extend from the surface where the semiconductor element is mounted to the back surface. This enables to be secured a wide area of an electrically conductive portion when mounting the support body by soldering.

The present invention relates to a semiconductor device comprising the semiconductor element and the support body whereon the semiconductor element is mounted. Thus, such a semiconductor can be made having the support body with less burrs and chippings. The semiconductor device of the present invention can be mounted on a circuit board having an electric wiring pattern formed thereon with high reliability.

It is preferable that the support body has the recess for mounting the semiconductor element therein, the electrical conductor is preferably disposed in a part of the recess, the metal is disposed at least on one of the corners so as to extend from the surface where the semiconductor element is mounted to the back surface, and an inside of the recess and the top face of the recess side wall are covered with a resin. Since the ceramic substrate is permeable to moisture and air, a resin coating is provided so as to prevent permeation of such materials.

The top face of the recess side wall is preferably covered with a resin on a portion where the ceramic base is exposed, since this prevents solder from creeping up when the semiconductor element is mounted.

Portions of the inside of the recess and the top face of the recess side wall where the ceramic base is exposed is preferably impregnated with a resin, so as to prevent permeation of moisture and air, and prevent solder from creeping up when mounting.

The present invention relates to a method of manufacturing the support body whereon a semiconductor element can be mounted, comprising processes of: making a ceramic substrate by stacking ceramic sheets with electrical conductors disposed thereon; forming grooves by incising the ceramic substrate; and cleaving the ceramic substrate along the grooves, wherein the ceramic substrate is cleaved by applying a bending moment and a tensile force to the ceramic substrate. With this method, a support body made of ceramic can be formed easily without causing burrs or chippings in a cleavage surface.

The bending moment is preferably applied by bringing a cleaving tool into contact with a surface opposite to the surface having the grooves of the ceramic substrate at a position corresponding to a groove. Since this enables separation of chips without causing cleavage surfaces to rub against each other, a quantity of ceramic powder generated when cleaving can be reduced. A cleavage surface of this separated ceramic substrate can also be formed substantially at right angles to the groove. Thus, a number of support bodies can be made from a single ceramic substrate.

The ceramic substrate may also be preferably cleaved by applying a bending moment in such a manner as the substrate becomes concave on the side thereof where the groove is formed so that opposing top edges of recess side walls make contact with each other. With this method, a support body made of ceramic can be formed easily without causing burrs or chippings in a cleavage surface.

The grooves of the ceramic substrate may also be formed in longitudinal and lateral directions on a front surface, while through holes may be made at intersections of the grooves in the longitudinal and lateral directions, with the through holes filled with a metallic material to make electrical conductors. The metallic material provided in the through holes is preferably connected with an electrode provided on the back surface. Thus, an electrical conductor can be easily provided on a side face of the ceramic substrate. It is also made easy to locate the position where the though hole is to be formed.

The ceramic substrate may also be provided with a plurality of through holes along which grooves are drawn on a surface of the ceramic substrate. While a through hole provided with an electrical conductor is formed in the ceramic substrate, forming a groove along the through hole makes it easier to cleave the ceramic substrate into individual ceramics packages.

The ceramic substrate is fired to form a groove after incising the ceramic substrate to a depth in a range from ¼ to ¾ of a thickness of the ceramic substrate. When the depth of the groove is slight, burrs are generated. On the other hand, when the depth of the groove is substantial, burrs tend to be easily generated on a cleavage surface because the ceramic substrate splits off easily by only applying a slight shock. It is hard to produce because of a risk of splitting off when removing from a die.

Such a process may also be employed as ceramic sheets having electrical conductors disposed thereon are stacked one on another to form a ceramic substrate having a recess formed therein, which is cleaved along grooves drawn along side walls of the recess, thereby making a support body that has electrical conductors exposed on a cleavage surface and in the recess. This method makes it possible to stably mount the support body on an external circuit board when the cleavage surface of the ceramic substrate is used as a mounting surface.

In the semiconductor device comprising the semiconductor element and the support body made of a stack of ceramic layers having the recess wherein the electrical conductors are electrically connected with the semiconductor element, at least a part of a top face of the recess side wall is preferably covered by a resin, in order to prevent moisture from infiltrating.

The resin may also be caused to impregnate the top face of the recess side wall where a ceramic base is exposed. This makes it possible to prevent solder from creeping up, and thus make a semiconductor device of high reliability when mounting the semiconductor device on an external circuit board.

It is preferable that the semiconductor element is covered by the resin, and part of the resin is disposed to extend over the top face of the recess side wall. This makes it possible to prevent permeation of moisture.

The resin preferably contains at least one kind of fluorescent material selected from among a fluorescent material that contains Al and at least one element selected from among Y, Lu, Sc, La, Gd, Tb, Eu, Ga, In and Sm, and is activated with at last one element selected from among rare earth elements, and a fluorescent material that contains N, at least one element selected from among Be, Mg, Ca, Sr, Ba and Zn and at least one element selected from among C, Si, Ge, Sn, Ti, Zr and Hf, and is activated with at last one element selected from among rare earth elements. This constitution makes it possible to make a light emitting device that emits light by blending light from a semiconductor light emitting element and light emitted by a fluorescent material that is excited by the light emitting element.

BRIEF DESCRIPTION OF THE DRAWINGS

FIG. 5 is a schematic top view showing one example of a package of the present invention.

DETAILED DESCRIPTION OF THE PREFERRED EMBODIMENTS

Figure 1A:
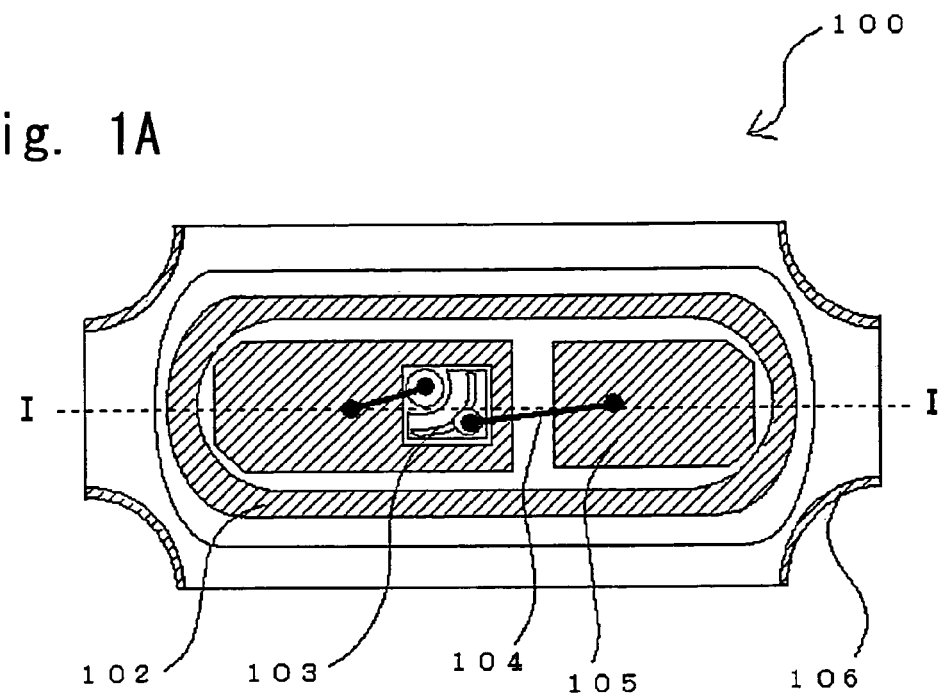
FIG. 1A is a schematic top view of one example of a semiconductor device of the present invention.

Best modes for carrying out the present invention will now be described below with reference to the accompanying drawings. It should be noted, however, that forms described below are intended to exemplify a method of manufacturing a support body for a semiconductor element and a semiconductor device employing the support body made of ceramic that embodies a technical idea of the present invention, and the present invention is not limited to those described below. In some of the accompanying drawings, size and positional relationships are exaggerated in order to make it easier to understand their description.

(Method of Manufacturing Support Body for Semiconductor Element)

A support body made of ceramic for mounting a semiconductor element thereon is generally made by using a sheet-form material called a ceramic green sheet. The support body is formed by forming through holes in a stack of ceramic green sheets, forming electrical wirings in a recess wherein the semiconductor element is to be mounted and on a side wall of the through holes, and firing the stack. At a time the ceramic green sheets have been stacked, grooves are formed along centers of a number of through holes. The grooves are formed by firing the stack of ceramic green sheets after incising the ceramic green sheets. This ceramic substrate is separated into individual support bodies by applying a force along the grooves. When the ceramic substrate is separated, a wiring conductor provided in a through hole is exposed on a side face of the support body and is connected to a wiring conductor provided in the recess. Therefore, when the semiconductor element is mounted on a cleavage surface of the ceramics substrate, namely the side face of the support body, a light emitting device that emits light mainly in a direction substantially parallel to a mounting surface can be made. The support body for a semiconductor element in the present invention refers to a member whereon a semiconductor element and an electrical conductor that supplies electric power to the semiconductor element can be mounted, and includes a plate-shaped substrate and a support body that has a recess for mounting a semiconductor element therein, such as a ceramic package.

When separating the ceramic substrate into individual support bodies, however, a support body may be broken differently or chipped and uniform and smooth cleavage surfaces cannot be obtained. As a result, a cleavage surface formed by a conventional manufacturing method results in variability in optical characteristics of a light source when a light emitting device comprising the semiconductor element mounted on the support body is soldered onto a circuit board. For example, a surface emitting light source is made by combining an optical guide plate, wherein light from the light emitting device is caused to enter through an end face of a plate-shaped transparent material and emerge from another surface through reflections in the transparent material, and a plurality of light emitting devices. At this time, inclination of the light emitting device soldered onto the circuit board differs among the light emitting devices. This difference leads to an angle of incidence of light on an end face of the optical guide plate that is different from light emitting device to light emitting device, thus resulting in uneven emission of light from the surface emitting light source and/or variability in optical characteristics such as optical orientation among the light emitting devices.

In order to solve the problems described above, the inventors of the present application modified the method of manufacturing the support body for a semiconductor element whereon the semiconductor element can be mounted, wherein the ceramic substrate is formed by stacking ceramic sheets having electrical conductors provide thereon and cleaving the ceramic substrate along grooves formed thereon, so as to include a process of separating the ceramic substrate by applying a bending moment and a tensile force to the ceramic substrate. A support body having the electrical conductors exposed on a cleavage surface and in a recess is obtained by cleaving the ceramic substrate along a groove formed in the side wall that constitutes a recess. In other words, the method of manufacturing the substrate for a semiconductor element includes at least the following processes.

First, ceramic green sheets not yet fired, or ceramic green sheets having through holes, are stacked so as to form a stack of unfired ceramic sheets having a recess. Or, alternatively, fired ceramic sheets of a flat shape are stacked to form a ceramic substrate.

A predetermined pattern of grooves is formed on the stack of ceramic green sheets for separating the ceramic sheets. For example, grooves are formed in a matrix of straight lines in a longitudinal direction and straight lines in a lateral direction. Each groove has such a depth that does not affect mechanical strength of a fired stack of ceramic sheets. The grooves are formed by incising the ceramic green sheets. These incised portions are preferably in a range from ¼ to ¾ of a thickness of the ceramic substrate. The incised portions are more preferably in a range from approximately ⅜ to ⅝ of the thickness of the ceramic substrate. This makes it possible to form an even cleavage surface. This makes it possible to improve productivity in mass production, since this prevents split off during a carrying step. This incising method can suppress occurrence of such defects as breakage and chipping of the ceramic substrate rather than making the groove by polishing. The grooves are preferably formed not only in a semiconductor element mounting surface but also in a back surface. When making the grooves in the back surface, a sum of the depth of the groove in a top surface and the depth of the groove in the back surface is preferably in a range from ¼ to ¾ of the thickness of the ceramic substrate. A number of the recesses surrounded by the grooves formed in the longitudinal direction and lateral direction may be one or more, depending on a number of semiconductor elements to be mounted therein. The grooves may also be formed along central lines of through holes formed in the stack of ceramic green sheets. This enables easy cleaning of the ceramic substrate that is a fired stack of ceramic sheets. A support body that has been separated with an electrical conductor provided on an inner surface of a through hole being exposed on a cleavage surface can be used to make a sideways emission type light emitting device. The cleavage surface herein includes an inner surface that constitutes grooves of the ceramic substrate and surface generated by cleaving the ceramic substrate.

The grooves are formed on the stack of ceramic green sheets in the longitudinal and lateral directions. A through hole is made at an intersection of longitudinal and lateral grooves located at a center thereof. The through hole is filled with a metallic material that establishes electrical continuity with an electrode provided on a back surface.

The stack of ceramic green sheets is then fired and an electrical wiring and, as required, an optical reflector are formed by plating. This fired stack of ceramic green sheets is cleaved along the grooves, so as to obtain individual ceramic packages. FIG. 3A through FIG. 3C and FIG. 4A through FIG. 4C are side views schematically showing processes of separating a ceramic substrate in sequence in a ceramic package manufacturing process of the present invention. There are at least the following forms in a method of manufacturing a ceramic package according to the present invention.

Mode 1: A force applying point may be in a direction of extending a depth of a groove on a surface opposite to a surface of the ceramic substrate where the grooves are formed. Specifically, assuming that a groove formed on a principal surface of the fired stack of ceramic sheets is extended in a direction of depth, an intersection of an extended line and the principal surface where grooves are not formed is used as a point of applying the force. A bending moment can be applied by bringing a cleaving tool to the force applying point.

This point is used to apply a force that has great influence on ease of cleaving, condition of a cleavage surface, and magnitude of an external force required for cleaving.

Figure 4A:
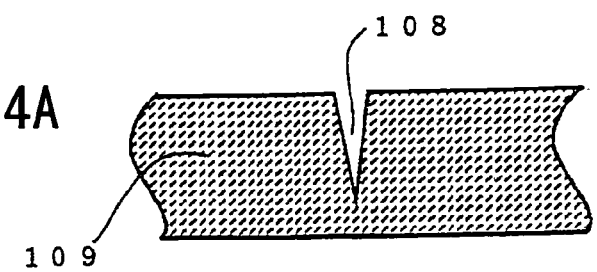
FIG. 4A is a side view schematically showing manufacturing process step 1 of the present invention.
Figure 4B:
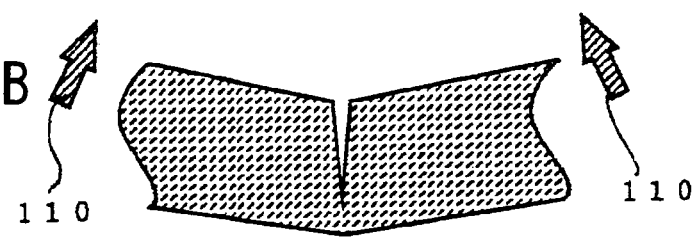
FIG. 4B is a side view schematically showing manufacturing process step 2 of the present invention.
Figure 4C:
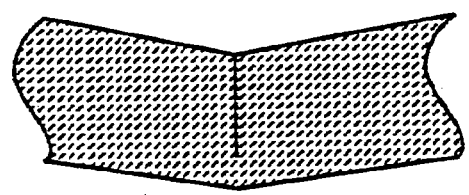
FIG. 4C is a side view schematically showing manufacturing process step 3 of the present invention.
Figure 4D:
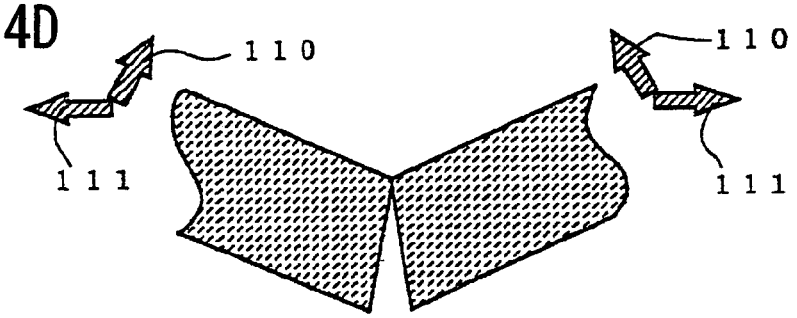
FIG. 4D is a side view schematically showing manufacturing process step 4 of the present invention.
Figure 4E:
FIG. 4E is a side view schematically showing manufacturing process step 5 of the present invention.

Mode 2: A bending moment is applied to the ceramic substrate so that a compressive stress is generated on a side where the grooves are formed, and a tensile force is generated on an opposite side, thereby bringing upper ends of side walls on both sides of the recess into contact with each other. Specifically, as shown in FIG. 4B, a bending moment is applied to a fired ceramic substrate so that upper ends of side walls on both sides of the recess come into contact with each other. Then as shown in FIG. 4D, a bending moment is applied with a contact point of the upper ends of the side walls as a center of moment, while pulling apart the ceramic substrate in a direction parallel to a principal surface, thereby breaking the ceramic substrate. The grooves may also be formed on the surface opposite to the surface having the grooves of the ceramics substrate at a position corresponding to the grooves, to an extent that does not affect mechanical strength of the ceramic substrate.

With a manufacturing method described above, a support body having a predetermined cleavage surface can be made without causing burrs or chippings in a cleavage surface. The support body made of ceramic, particularly a ceramic package having a recess to make a sideways emission type light emitting device can be easily manufactured.

(Semiconductor Device Employing Support Body Made of Ceramic for a Semiconductor Element)

Figure 1B:
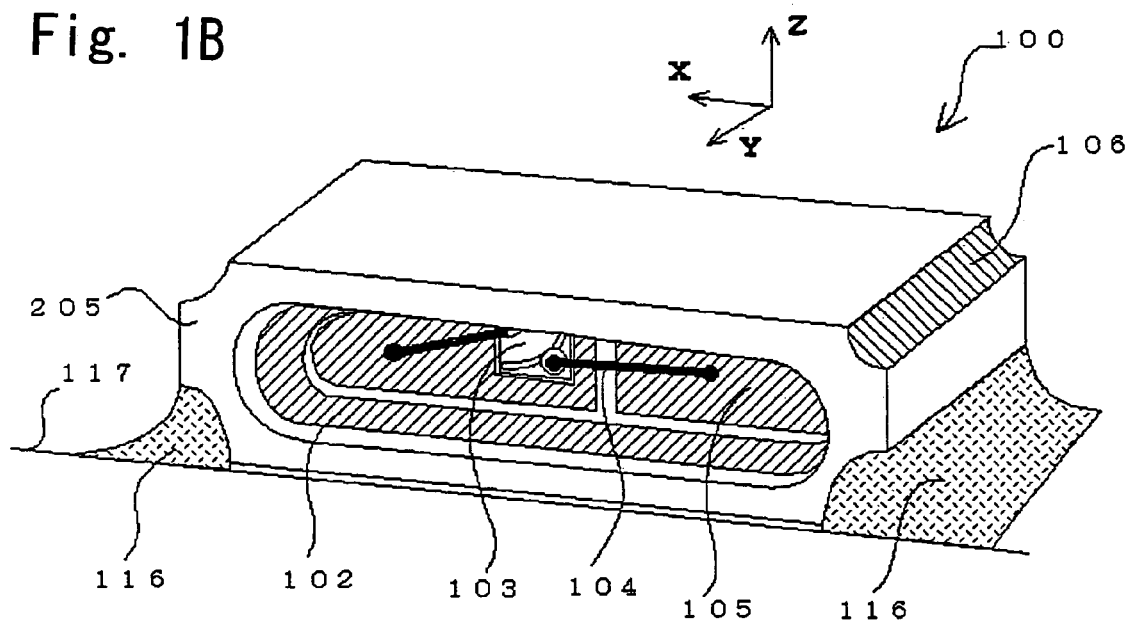
FIG. 1B is a schematic perspective view of one example of the semiconductor device of the present invention.
Figure 2:
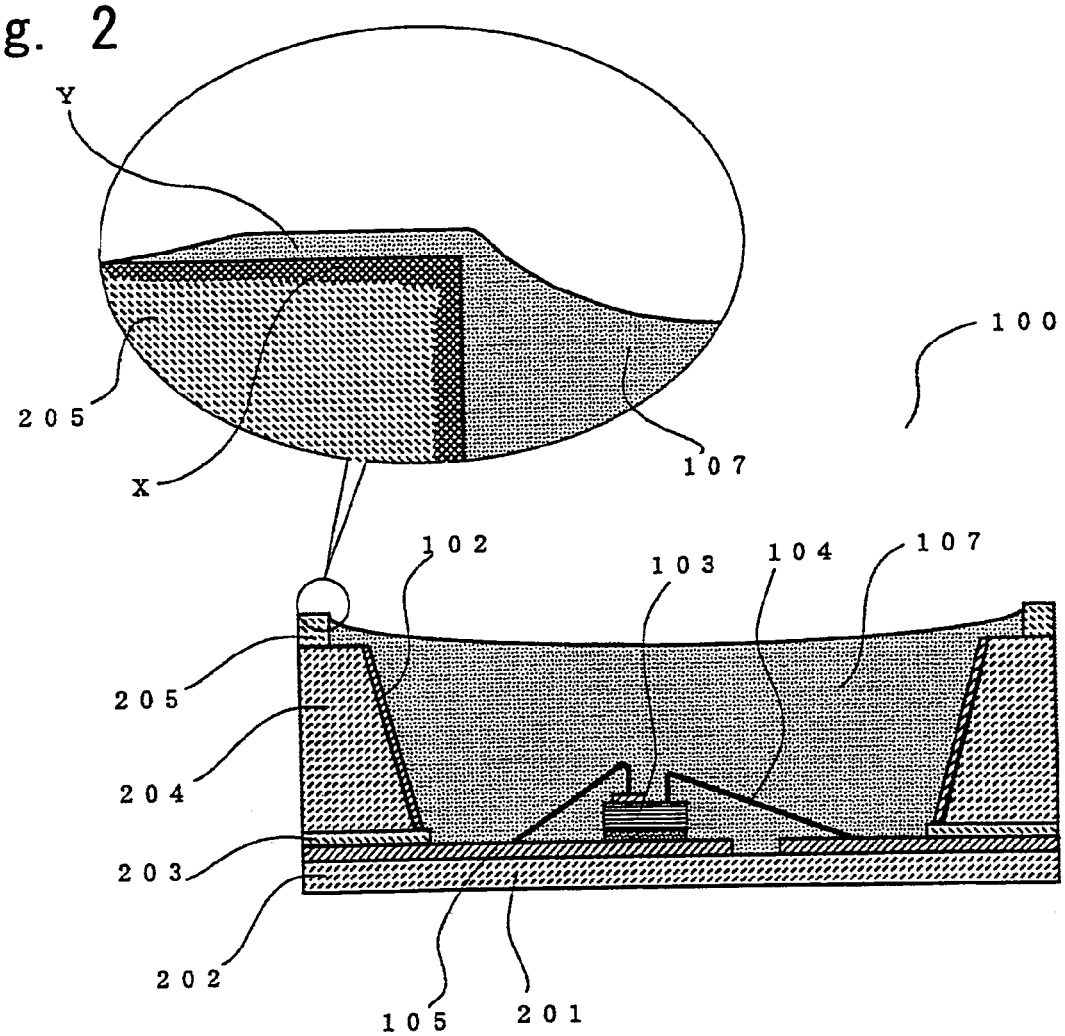
FIG. 2 is a schematic sectional view of one example of the semiconductor device of the present invention.
Figure 9A:
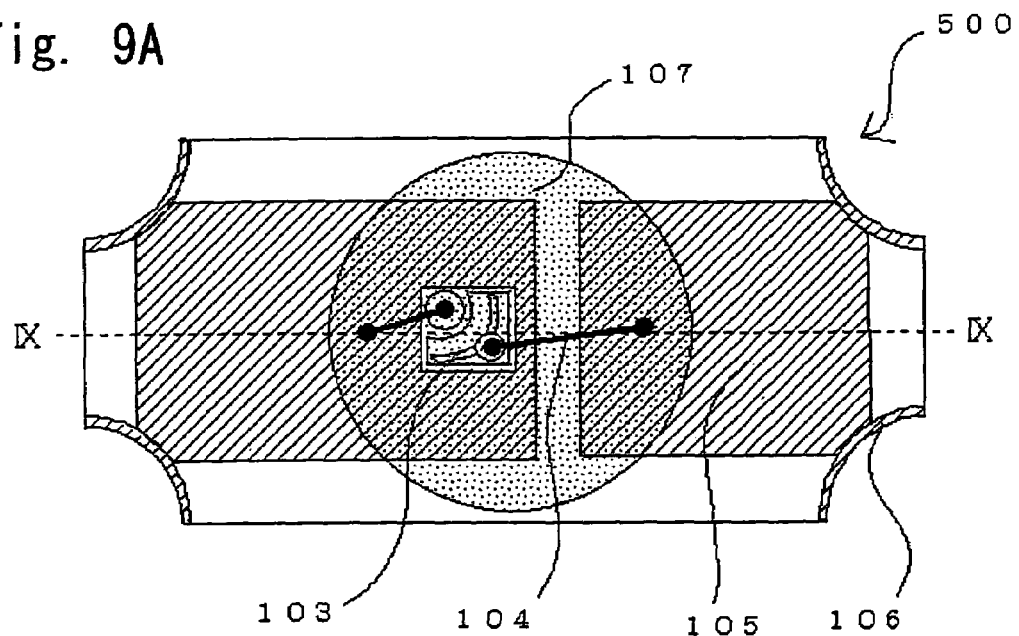
FIG. 9A is a schematic top view showing one example of a light emitting device of the present invention.
Figure 9B:
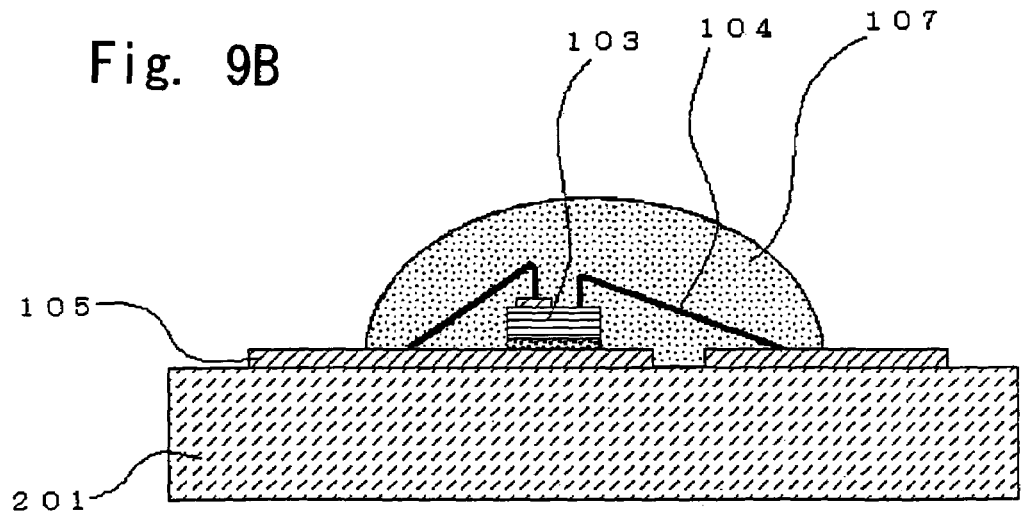
FIG. 9B is a schematic perspective view of one example of a semiconductor device of the present invention.

FIG. 1A is a schematic top view of a semiconductor device according to this embodiment, and FIG. 2 is a schematic sectional view taken along line I-I in FIG. 1A. FIG. 1B is a perspective view schematically showing the semiconductor device of the present invention being electrically and mechanically connected by soldering to a mounting surface where a wiring pattern has been formed. As shown in FIG. 1B, the semiconductor device according to this embodiment is a sideways emission type light emitting device that can emit light with an optical axis disposed in a direction (Y direction) substantially parallel to mounting surface 117. FIG. 9A is a schematic top view of a semiconductor device according to another embodiment of the present invention, and FIG. 9B is a schematic sectional view taken along line IX-IX in FIG. 9A. Semiconductor device 500 shown in FIG. 9 comprises a light emitting element 103 placed on a substrate made of ceramic that is electrically connected to electrical wiring 105 by an electrical wire 104, while the light emitting element 103 is covered by a sealing member 107. The electrical wiring 105 is connected to electrical wiring 106 exposed on a side face of the substrate, while an electrical circuit is provided on a surface opposite to a light emitting element mounting surface of the ceramic substrate.

Semiconductor device 100 shown in FIGS. 1A and 1B comprises a support body made of a stack of ceramic sheets having a recess wherein an electrical conductor is provided, and a semiconductor element is electrically connected to the electrical conductor in the recess, wherein at least a top face of a recess side wall is covered by a resin. Specifically, the top face on a light emission observing side of a side wall that forms the recess of a ceramic package is covered by a resin over at least a part thereof. A part of a sealing member is extended over the top face of the recess side wall or is impregnated in the side wall of the recess. The top face of the recess side wall covered by the resin can be arranged by screen printing or potting resin on the top face of the recess side wall.

Alternatively, a part of the sealing member that covers at least the light emitting element in the recess of the semiconductor device is extended so as to creep from the recess of the ceramic package over the top face of the recess side wall or is impregnated in the side wall.

Resin or the sealing member preferably includes at least one selected from the group of epoxy resin, silicone resin, modified epoxy resin, modified silicone resin, acryl resin or a mixture thereof. This is because a porous ceramic is highly permeable to epoxy resin and silicone resin, which can easily be extended over the top face of the recess side wall or is impregnated in the side wall of the recess. A ceramic package that is more porous and is highly permeable to the sealing member can be made by controlling a firing temperature of the ceramic.

When the semiconductor device of this embodiment is used as a sideways emission type light emitting device, solder used in reflow is repelled by resin that covers the top face of the recess side wall or by resin that impregnates the side wall of the recess, and is prevented from creeping up to a light emitting plane. Or the solder is repelled by the sealing member extended over the top face of the recess side wall or impregnated in the side wall of the recess, and cannot creep up to the light emitting plane. This is supposedly because the resin used as the sealing member does not have affinity with a metallic material of the solder. Thus, the solder used in reflow is prevented from covering a light emitting surface and does not have an adverse effect on the optical characteristics, and therefore a light emitting device of high reliability can be made. When connecting the semiconductor device and an outside circuit board having a wiring circuit thereon with solder, such a problem does not occur that solder lines, which should be separated as positive and negative polarities in the circuit, are brought into contact with each other. As a result, a semiconductor device of high reliability where short-circuiting does not occur can be made.

Figure 8:
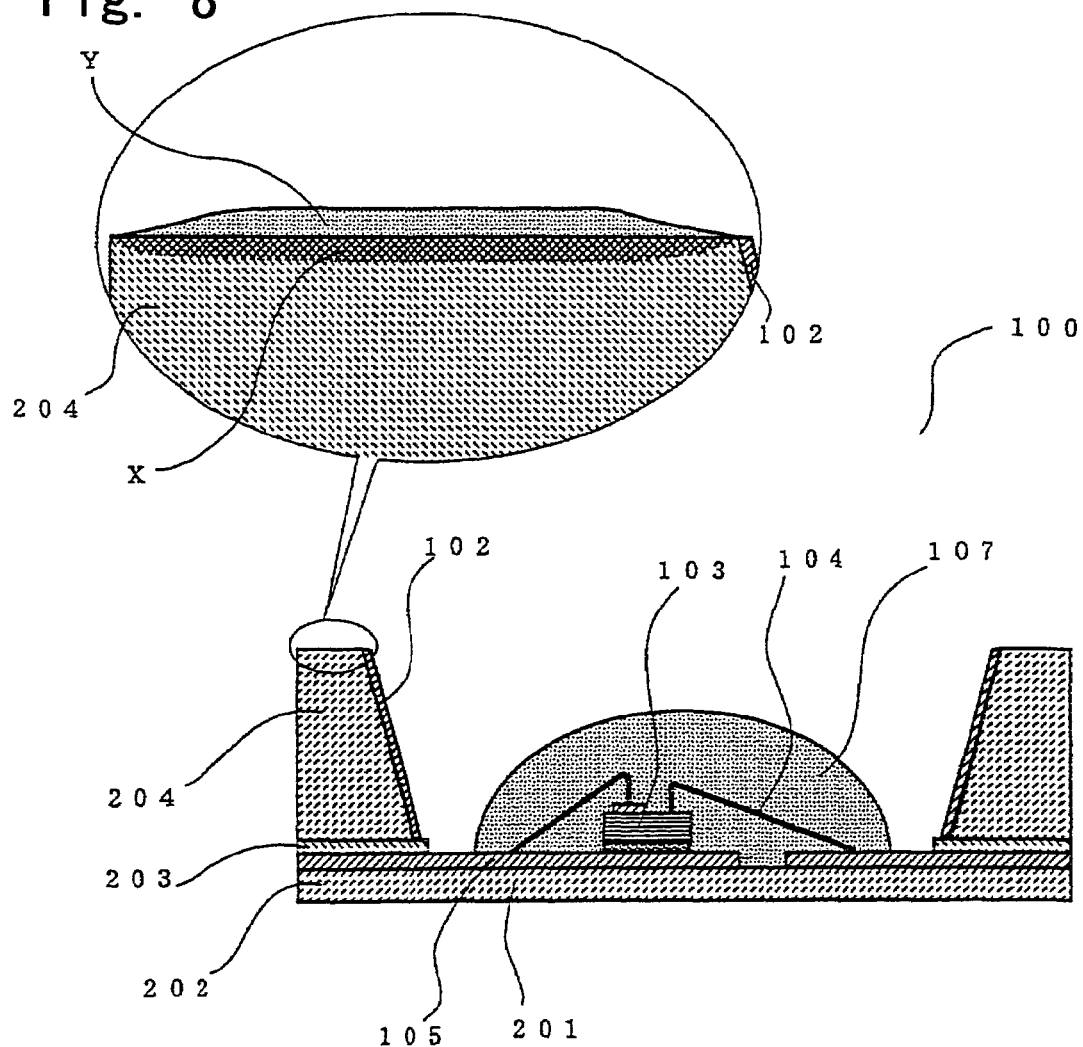
FIG. 8 is a schematic sectional view showing one example of a light emitting device of the present invention.

FIG. 8 is a schematic sectional view of a semiconductor device according to another embodiment of the present invention. A sealing member of this embodiment does not cover reflecting surface 102 in a recess, while covering at least semiconductor element 103 and a part of a bottom surface of the recess. When a portion covered by the sealing member is restricted, light emerging from the sealing member is reflected from the reflecting surface 102 and is directed toward a light emitting surface through air. As a result, undesirable scattering and absorption of light by an excessive sealing member is minimized and optical output of a light emitting device can be improved.

Resin of this embodiment also covers a top face of a recess side wall as indicated by Y in the enlarged sectional view of FIG. 8. Electrically conductive reflecting surface 102 is provided on an inner wall surface that forms a recess of a ceramic package, so as to make a light emitting device wherein sealing member 107 does not cover the reflecting surface 102 such as the light emitting device of another embodiment shown in FIG. 8. In this case, solder may creep up to the reflecting surface 102 during reflow. Moreover, short-circuiting may occur as solder lines, which should be separated as positive and negative polarities in a circuit, are brought into contact with the reflecting surface 102.

In the light emitting device of this another embodiment, since creeping up of the solder is prevented by resin that covers the top face of the recess side wall, the solder never touches the reflecting surface during reflow. As a result, covering of a light emitting surface by the solder is suppressed and an adverse effect on optical characteristics is eliminated. Now, constitution of this embodiment will be described below.

[Ceramic Package]

A ceramic package manufactured according to the present invention is made of a ceramic material to protect a semiconductor element from an environment. The ceramic package is an example of a support body for a semiconductor element whereon the semiconductor element is mounted in a recess and members are provided for electrical connection with an exterior. This ceramic material is preferably alumina, aluminum nitride, mulite or the like. Particularly, a ceramic material consisting of 90 to 96% by weight of alumina and 4 to 10% by weight of a sintering agent such as clay, talc, magnesia, calcia, silica or the like that is sintered at a temperature from 1500 to 1700° C., or a ceramic material consisting of 40 to 60% by weight of alumina and 60 to 40% by weight of a sintering agent such as borosilicate glass, cordierite, foresterite, mulite or the like that is sintered at a temperature from 800 to 1200° C. is utilized.

Such a ceramic package can be formed in various shapes in a stage of green sheets before firing. A wiring conductor in the package is made of a paste material comprising a resin binder containing high melting point metals such as tungsten and molybdenum. The paste material is formed in a desired shape via a through hole provided in each green sheet by screen printing, and is turned into the wiring conductor by firing. By stacking the green sheets having the through hole in a multi-layer structure, a recess to mount a semiconductor element therein is formed. Therefore, recesses of various shapes can be formed by stacking green sheets having through holes of a circular or oval shape and/or having different sizes when viewed from a light emission observing side. Moreover, a recess of which an inner diameter increases toward a mouth can be formed by combining green sheets having through holes of which an inner diameter increases in a particular direction, and green sheets having through holes of different shapes and sizes. The green sheets having through holes of which the inner diameter increases in a particular direction can be made by using a cutting tool of which a cutting edge becomes narrower in a direction of contact with the green sheets. Alternatively, green sheets may be formed by changing an angle of contact of the cutting tool, used in forming ordinary through holes, with the green sheets. Furthermore, green sheets having through holes of which the inner diameter increases in a particular direction can be made by stacking a plurality of green sheets having through holes with an inner diameter varied stepwise so as to form a stepped inner wall surface, and pressing a molding die against the stepped inner wall surface.

The ceramic package is made by stacking the green sheets and sintering this stack. A dark color can also be obtained by containing $Cr_2O_3$, $MnO_2$, $TiO_2$ or $Fe_2O_3$ in each green sheet.

A recess of the package is for mounting a semiconductor element and/or an electrically conductive wire therein. Therefore, a size of the recess may be such that a semiconductor element can be mounted therein by die bonding or the like, and electrical connection with the semiconductor element can be made by wire bonding. The semiconductor element can be bonded onto a bottom of the package, for example, by use of a thermosetting resin. Specifically, epoxy resin, acrylic resin or imide resin may be used. In case flip chip mounting is employed by directly connecting electrodes of the semiconductor element and a wiring conductor provided in the recess disposed to oppose each other, Ag paste, ITO paste, carbon paste, a metal bump or the like may be used to electrically connect the wiring conductor. The semiconductor element may be bonded onto an exposed ceramic material via an insulating adhesive. With this constitution, the semiconductor element can be secured more firmly on the ceramic package compared to a case where it is bonded onto the wiring conductor by use of an insulating adhesive.

[Reflecting Surface]

When the ceramic package is used as a light emitting device that uses a light emitting element as the semiconductor element, a light reflecting surface can be formed in a part of an inner surface of the recess. Since ceramics generally transmit light, efficiency of the light emitting device to extract light can be improved by forming the reflecting surface so as to reflect light from the light emitting element toward a light emission observing side. The reflecting surface 102 is provided for a part of the inner surface of the recess in a principal surface of the ceramic package, and includes a first metal layer that makes direct contact with a ceramic base material of the ceramic package and serves as a base for a second metal layer, and the second metal layer reflects light emitted by the light emitting element so as to efficiently extract the light to an exterior. Now the first metal layer and the second metal layer will be described in detail below. The reflecting surface of this embodiment can also serve as an electrical conductor for supplying power to the semiconductor element in a process of forming the ceramic package.

(First Metal Layer)

The first metal layer is formed so as to make direct contact with the support body made of ceramic and serves as a base for a second metal layer. As such, the first metal layer that is formed when firing the ceramic must not melt when forming the ceramic. Metals having such a high melting point suitable for the first metal layer include tungsten, chromium, titanium, cobalt, molybdenum and alloys thereof. The first metal layer can be formed by mixing particles of such a metal in a resin paste, applying the paste to an inner surface of a recess of a green sheet, by coating or printing, and firing the green sheet. Bonding of the second metal layer formed on the ceramic and the first metal layer, and bonding of a sealing member formed on the second metal layer can be controlled by controlling a particle size of the metal of the first metal layer. By controlling the particle size of the metal used in the first metal layer, surface roughness of the second metal layer formed thereon can be controlled. Thus, the particle size of the metal used in the first metal layer is preferably in a range from 0.3 to 100 μm, and more preferably from 1 to 20 μm.

Instead of screen printing on the inner surface, the reflecting surface can also be formed by filling an opening of the green sheet with an electrically conductive paste and then drilling at a center of the opening with a laser beam, thereby leaving an electrically conductive layer on an inner wall. A carbon dioxide gas laser, YAG laser, excimer layer or the like may be used as a laser. The first metal layer may not necessarily be formed over an entire surface of the inner wall. Light can be reflected only in a desired direction by leaving a portion where the first metal layer and the second metal layer are not formed. Light can be seen as diffusing through the ceramic in the portion where the metal layers are not formed. A view angle can be increased by forming the metal layers partially on the inner wall. The first metal layer that constitutes a reflecting surface can be formed by applying a resin paste, containing a high melting point metal that constitutes the wiring conductor, onto the inner wall.

(Second Metal Layer)

The second metal layer is formed on the first metal layer, to serve as a reflector for efficiently extracting light emitted by the light emitting element to the exterior. The second metal layer can be formed on the first metal layer relatively easily by plating or vapor deposition. The second metal layer may be made of a metal that has at least a 90% reflectivity to light emitted by an LED chip, such as gold, silver, platinum, aluminum, nickel, palladium or an alloy thereof, or a multi-layer film made of such metals.

The second metal layer may also be formed at the same time as surface treatment is applied to a wiring pattern formed in the ceramic package. That is, Ni/Ag or Ni/Au may be plated on electrical wiring provided in the ceramic package at the same time as the second metal layer is formed, in order to improve solderability. The second metal layer and the electrical wiring may also be formed by plating separately. Loss of light below the light emitting element can be suppressed by covering the electrical wiring provided at the bottom of the recess with the second metal layer.

[Semiconductor Element]

The support body made of ceramic can support a light emitting element (may also be called an LED chip in this specification), a light receiving element and a protective element that protects functional elements from breakage due to over voltage, mounted thereon in combination or separately. Although this embodiment deals with a case where a light emitting element is used as the semiconductor element, it need not be said that the semiconductor element of the present invention is not limited to this light emitting element.

(Light Emitting Element)

As the light emitting element that can be mounted on the support body made of ceramic, such elements having a light emitting layer made of GaAlN, ZnS, ZnSe, SiC, GaP, GaAlAs, AlN, InN, AlInGaP, InGaN, GaN, AlInGaN or other semiconductor formed on a substrate may be used. Preferable structures of the light emitting element include homojunction structure, heterojunction structure or double heterojunction structure that has an MIS junction, PIN junction or PN junction. Emission wavelength can be controlled over a broad range from ultraviolet to infrared regions by selecting a semiconductor material and adjusting composition of mixed crystal. A light emitting layer may be formed as a thin film, where a quantum effect can be utilized, having a single quantum well structure or multiple quantum well structure.

A gallium nitride semiconductor is preferably used as a semiconductor material that can form a light emitting element having high luminance. To emit red light, a semiconductor based on gallium, aluminum and arsenic, or a semiconductor based on aluminum, indium, gallium and phosphorus is preferably used, but it need not be said that various semiconductors may be used depending on an application.

When a gallium nitride semiconductor is used, the substrate can be made of sapphire, spinel, SiC, Si, ZnO, GaAs, GaN single crystal or the like. In order to form a gallium nitride semiconductor with good crystallinity and characteristics suitable for mass production, it is preferable to use a sapphire substrate. An example of an LED chip formed from a nitride semiconductor will be described below. A buffer layer is formed from GaN, AlN or the like on a sapphire substrate. On the buffer layer, a first contact layer made of GaN having N or P type, an active layer made of thin InGaN film that has quantum effect, a cladding layer made of AlGaN having P or N type, and a second contact layer made of GaN having P or N type are formed in this order. The gallium nitride semiconductor has N-type electrical conductivity when not doped with an impurity. It is preferable that Si, Ge, Se, Te, C or the like is introduced as an n-type dopant if an N-type gallium nitride semiconductor having desired characteristics such as efficiency of light emission is to be formed.

When a P-type gallium nitride semiconductor is to be formed, on the other hand, Zn, Mg, Be, Ca, Sr, Ba or the like is added as a P-type dopant. Since a gallium nitride semiconductor is difficult to turn into P-type simply by doping with a P-type dopant, it is necessary to anneal the semiconductor by heating it in a furnace or irradiating it with plasma after introduction of the P-type dopant. A positive electrode and a negative electrode are formed by partially etching a semiconductor wafer thus formed. Then, after forming electrodes on both contact layers, the wafer is diced into chips, thereby making the LED chips.

The light emitting element can be used in plurality, and through proper selection of a combination thereof, color blending performance can be improved when providing white light emission. For example, two light emitting elements capable of emitting greenish light and one light emitting element capable of emitting bluish light and reddish light may be combined. In order to make a full-color light emitting device for a display apparatus, it is preferable to combine such emission spectra as wavelengths from 610 to 700 nm for red, wavelengths from 495 to 565 nm for green and wavelengths from 430 to 490 nm for blue. In order to make a light emitting device that emits white light by color blending, it is preferable to use a light emitting element that emits light of wavelengths from 400 nm to 530 nm, more preferably from 420 nm to 490 nm, in consideration of a complementary color relationship with light emitted by the fluorescent material, deterioration of a translucent resin and other factors. In order to improve efficiency of excitation and light emission of the fluorescent material, the emission wavelengths are more preferably in a range from 450 to 475 nm. A light emitting element that has a principal emission wavelength in an ultraviolet region of a wavelength shorter than 400 nm, or in a short wavelength region of visible light, may also be used by combining with a member that is less likely to be deteriorated by ultraviolet ways.

(Protective Element)

As a protective element, a zener diode that turns to a conductive state when a voltage higher than a threshold is applied, or a capacitor that absorbs voltage surge, may be used.

The zener diode is constituted from a p-type semiconductor region having a positive electrode and an n-type semiconductor region having a negative electrode, and is connected in reverse parallel connection with a p-type electrode and an n-type electrode of the light emitting element. In other words, the n-type electrode and the p-type electrode of the light emitting element are connected to electrodes of a p-type semiconductor region and an n-type semiconductor region of the zener diode, respectively. Moreover, a zener diode may also be used for a sub-mount where the light emitting element is provided by flip-chip mounting via bump. At this time, the n-type electrode and the p-type electrode of the light emitting element are mechanically and electrically connected to the electrodes of the p-type semiconductor region and the n-type semiconductor region of the zener diode that is exposed on a surface of the sub-mount, respectively. The positive and negative electrodes provided on the sub-mount serving as the zener diode can be connected to electrical wiring by electrically conductive wires. When the sub-mount is caused to serve as the zener diode, as described above, voltage across the positive and negative electrodes of the light emitting element is latched at a zener voltage and never increases above the zener voltage even if a voltage above the zener voltage is applied across the positive and negative electrodes of the light emitting element. Thus, an excessive voltage is prevented from being applied to the light emitting element so as to protect the light emitting element from over voltage and prevent destruction and deterioration of the element.

For a capacitor used as a protective element, a surface-mounted chip component may be used. A capacitor of this type has electrodes formed in band-shape on both sides, with these electrodes being connected in parallel to positive and negative electrodes of the light emitting element. When an over voltage is applied across positive and negative leads of the capacitor, a charging current flows in the capacitor so as to reduce voltage across capacitor terminals, so that the over voltage is not applied to the light emitting element, thereby protecting the light emitting element from the over voltage. When noise that includes high frequency components is applied, the capacitor functions as a bypass capacitor and shuts off the noise.

[Sealing Member 107]

A sealing member is provided to cover the LED chip to protect the LED chip from forces and moisture coming from an outer environment, and emit light from the LED chip efficiently to an exterior. The sealing member may be made of a transparent material that has high weatherability such as epoxy resin, urea resin and silicone resin, light-permeable inorganic material that is produced from metal alkoxide as a starting material by a sol-gel process, glass or the like. The resin and the sealing member of this embodiment are preferably made of a transparent resin that has high permeability to ceramics.

In case LED chips are packaged with high density, it is more preferable to use epoxy resin, silicone resin, modified epoxy resin, modified silicone resin or a mixture thereof in consideration of such trouble as breakage of electrically conductive wires due to thermal shock. The sealing member may also include a diffusion agent in order to increase a view angle. For the diffusion agent, barium titanate, titanium oxide, aluminum oxide, silicon oxide or a mixture thereof can be preferably used. An organic or inorganic dye or pigment may also be included in order to cut off undesirable wavelengths. A fluorescent material that converts a wavelength of at least a part of light emitted by an LED chip may also be included.

[Fluorescent Material]

Fluorescent material used in the present invention absorbs a part of visible light or an ultraviolet ray emitted by the light emitting element, and emits light of a wavelength different from that of this absorbed light. The fluorescent material is, besides being included in the sealing member described above, included in a coating member provided to cover the LED chip and the insulating adhesive (for example, epoxy resin, silicone resin or a transparent inorganic material such as glass) used for securing the LED chip on the package and in the ceramic package (particularly a portion not covered by the reflecting surface). The fluorescent material may be, besides covering a surface of the sealing member, provided as a layer or a sheet containing the fluorescent material at a position spaced from the surface of the sealing member or from the light emitting element.

The fluorescent material is such that it is excited at least by light emitted by a semiconductor light emitting layer of an LED chip and emits light of converted wavelength, and is combined with a binding agent that secures the fluorescent material to form a wavelength converting member.

In case light emitted by the LED chip and light emitted by the fluorescent material are in relationship of complementary colors, white light can be generated by blending both lights. Specifically, there are such cases as the light emitted by the LED chip and the light emitted by the fluorescent material, that is excited by the former are primary colors of light (red, green and blue), or blue light emitted by the LED chip and yellow light emitted by the fluorescent material, that is excited by the former, are used.

Color of light emitted by the light emitting device can be controlled so as to generate white light of various color tones including that of an incandescent lamp by adjusting proportions of various kinds of resin and inorganic material such as glass that serve as binding agents between fluorescent materials, sedimentation time of a fluorescent material and a shape of the fluorescent material, and selecting an emission wavelength of the LED chip. It is preferable that the light emitted by the LED chip and the light emitted by the fluorescent material transit efficiently through the sealing member from the light emission observing side of the light emitting device.

Since the fluorescent material in a gas phase or liquid phase sediments by gravity, a layer having the fluorescent material more uniformly distributed can be formed by dispersing the florescent material in the gas phase or liquid phase. A desired fluorescent material layer can be formed by repeating this process a plurality of times.

The fluorescent material formed as described above may be provided either in a plurality of kinds in a wavelength converting member constituted from a single layer on a surface of the light emitting device, or in a single kind or a plurality of kinds in a wavelength converting member constituted from two layers. This constitution makes it possible to obtain white light through blending of light emitted by different fluorescent materials. In this case, it is preferable that the fluorescent materials have similar mean particle sizes and shapes in order to achieve satisfactory blending of the light emitted by the different fluorescent materials and minimize color unevenness. Particle size of the fluorescent material in the present invention is a value determined from a volumetric particle size distribution curve. The volumetric particle size distribution curve is determined from measurement of particle size distribution by a laser diffraction and diffusion method. Specifically, the fluorescent material is dispersed in 0.05% aqueous solution of sodium hexa-metaphosphate at a temperature of 25° C. and humidity of 70%, and measured with a laser diffraction particle size distribution measuring instrument (SALD-2000A) in a range from 0.03 to 700 μm.

In this embodiment, a fluorescent material made by combining an aluminum garnet fluorescent material represented by YAG fluorescent material and a fluorescent material capable of emitting red light, particularly a nitride fluorescent material, can be used. The YAG fluorescent material and the nitride fluorescent material may be either mixed and included in the wavelength converting member or included separately in different wavelength converting members formed in a plurality of layers. Different fluorescent materials will now be described below.

(Aluminum Garnet Fluorescent Material)

Aluminum garnet fluorescent material is a fluorescent material that contains Al, at least one element selected from among Y, Lu, Sc, La, Gd, Tb, Eu, Ga, In, and Sm, and at least one element selected from among Ga and In and is activated with at least one element selected from among the rare earth elements, and is excited by visible light or an ultraviolet ray emitted by an LED chip so as to emit light. Besides the YAG fluorescent material described above, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$ may be used. Among these, yttrium aluminum oxide fluorescent material of at least two kinds having different compositions that include Y and are activated with Ce or Pr are particularly preferably used in this embodiment.

Specifically, yttrium aluminum garnet fluorescent material (may be hereinafter called the YAG fluorescent material) activated with cerium may be used. For use with high luminance over a long period of time, in particular, $(Re_{1-x}Sm_x)_3(Al_{1-y}Ga_y)_5O_{12}$: Ce ($0 \leq x \leq 1$, $0 \leq y \leq 1$, where Re represents at least one kind of element selected from among Y, Gd and La) or the like is preferably used.

The $(Re_{1-x}Sm_x)_3(Al_{1-y}Ga_y)_5O_{12}$: Ce fluorescent material is durable against heat, light and moisture, because of a garnet structure. It also allows to be set a peak wavelength of excitation spectrum at around 470 nm. A broad emission spectrum that has an emission peak around 530 nm and tails off to 720 nm can be obtained.

RGB components can be increased by mixing at least two kinds of $(Re_{1-x}Sm_x)_3 (Al_{1-y}Ga_y)_5O_{12}$: Ce fluorescent material having different contents of Al, Ga, In, Y, La, Gd and Sm for the YAG fluorescent material. While some semiconductor light emitting elements are subject to variations in an emission wavelength, blended light of desired white-based color can be obtained by mixing at least two kinds of fluorescent material. Specifically, by combining fluorescent materials having different values of chromaticity to match an emission wavelength of the light emitting element, light of desired chromaticity can be emitted at any point on a chromaticity diagram in a region defined by points corresponding to the fluorescent materials and the light emitting element.

White light of a desired color tone can be emitted by blending blue light emitted by a light emitting element that employs a nitride semiconductor in a light emitting layer, green light emitted by a fluorescent material having a yellow body color for absorbing blue light and, as required, red light. In order to perform this color blending in the light emitting device, fluorescent material in powder or bulk form may be included in various resins such as epoxy resin, acrylic resin or silicone resin, and light-permeable inorganic material such as silicon oxide or aluminum oxide. Such a material that includes the fluorescent material can be used in various forms such as dots or layer as thin as permeable to light emitted by the LED chip, depending on an application. Light of desired color tones including that of an incandescent lamp may be produced by adjusting proportions of the fluorescent material and inorganic material and a quantity used in coating or filling.

Use of YAG fluorescent material enables to be made a light emitting device having high efficiency and resistance to light even when disposed adjacent or in proximity to an LED chip having illuminance of radiation in a range from (Ee) $=0.1$ W·cm$^{-2}$ to 1000 W~cm$^{-2}$.

Yttrium aluminum oxide fluorescent material activated with cerium, that is a fluorescent material capable of emitting light in green region, is durable against heat, light and moisture because of garnet structure and has a peak wavelength of excitation spectrum in a range from 420 nm to 470 nm. It also has peak emission wavelength λp around 510 nm, and has a broad emission spectrum that tails off to around 700 nm. Yttrium aluminum oxide fluorescent material activated with cerium, is a fluorescent material capable of emitting light in a red region also as a garnet structure and, is durable against heat, light and moisture and has a peak wavelength of excitation spectrum in a range from 420 nm to 470 nm. It also has a peak emission wavelength λp around 600 nm, and has a broad emission spectrum that tails off to around 750 nm.

Emission spectrum of the YAG fluorescent material having a garnet structure shifts toward shorter wavelengths when part of Al in a composition thereof is substituted by Ga, and shifts toward longer wavelengths when part of Y is substituted by Gd and/or La. In this way color of emitted light can be changed continuously by changing the composition. As a result, the fluorescent material has an ideal feature for converting light in a blue region emitted by the nitride semiconductor into white light, including continuously changing intensity of light of longer wavelength by changing a proportion of Gd. When less than 20% of Y is substituted, a green component increases and a red component decreases, while red the component increases but luminance shows marked decrease when at least 80% of Y is substituted. An excitation spectrum, too, of the YAG fluorescent material having a garnet structure shifts toward shorter wavelengths when part of Al is substituted by Ga, and shifts toward longer wavelengths when part of Y is substituted by Gd and/or La. A peak emission wavelength of the excitation spectrum of the fluorescent material is preferably shorter than the peak wavelength of the emission spectrum of the light emitting element. With this constitution, since the peak wavelength of the excitation spectrum substantially agrees with the peak wavelength of the emission spectrum of the light emitting element, color deviation can be prevented from occurring without decreasing an excitation efficiency of the fluorescent material, when current supply to the light emitting element is increased.

Stock material for the fluorescent material is made by mixing oxides of Y, Gd, Ce, La, Al, Sm, Pr, Tb and Ga, or compounds that can be easily turned into such oxides at a high temperature are well mixed in stoichiometrical proportions. Alternatively, a solution of a mixture of rare earth elements Y, Gd, Ce, La, Al, Sm, Pr, Tb in stoichiometrical proportions dissolved in an acid is coprecipitated with oxalic acid, of which a product is fired to obtain a coprecipitated oxide which is mixed with aluminum oxide and gallium oxide to obtain a stock material mixture. This mixture, with a fluoride such as ammonium fluoride added thereto as a flux, is put into a crucible and fired at a temperature from 1350 to 1450 in air for two to five hours. This fired mixture is crushed in a ball mill in a wet process, and undergoes processes of washing, separation, drying and sieving. In a method of manufacturing fluorescent material according to another embodiment, a mixture of stock materials of the fluorescent material and a flux is fired preferably in two stages: a first firing process performed in air or in a weak reducing atmosphere, and a second firing process Performed in a reducing atmosphere. The weak reducing atmosphere means an atmosphere having weak reducing power that is controlled to include at least such a concentration of oxygen that is required in a reaction to form a desired fluorescent material from a mixed material. The first firing process performed in the weak reducing atmosphere until formation of the fluorescent material of a desired composition is completed, makes it possible to prevent the fluorescent material from blackening and a light absorbing efficiency from decreasing. The reducing atmosphere of the second firing process refers to a reducing atmosphere that has higher reducing power than the weak reducing atmosphere. A fluorescent material having a higher absorption efficiency at an excitation wavelength can be made by firing in two stages as described above. In consequence, when a light emitting device is made by using a fluorescent material obtained as described above, a quantity of the fluorescent material required to obtain desired color tone can be reduced and efficiency of extracting light can be increased.

At least two kinds of yttrium aluminum oxide fluorescent materials of different compositions activated with cerium may be either mixed with each other or disposed separately. When the fluorescent materials of different compositions are disposed separately, it is preferable to dispose a fluorescent material that absorbs light of shorter wavelength nearer to the light emitting element and a fluorescent material that absorbs light of longer wavelength next to the first-mentioned fluorescent material. This arrangement achieves efficient absorption and emission.

(Nitride Fluorescent Material)

The fluorescent material of this embodiment may be a nitride fluorescent material that contains N, at least one element selected from among Be, Mg, Ca, Sr, Ba and Zn, and at least one element selected from among C, Si, Ge, Sn, Ti, Zr, and Hf, and is activated with at least one element selected from among the rare earth elements. The nitride fluorescent material used in this embodiment is a fluorescent material that absorbs visible light or an ultraviolet ray emitted by an LED chip or light emitted by the YAG fluorescent material so as to be excited and emit light. There can be manufactured fluorescent materials based on various combinations, for example, Ca—Ge—N: Eu,Z, Sr—Ge—N: Eu,Z, Sr—Ca—Ge—N: Eu,Z, Ca—Ge—O—N: Eu,Z, Sr—Ge—O—N: Eu,Z, Sr—Ca—Ge—O—N: Eu,Z, Ba—Si—N: Eu,Z, Sr—Ba—Si—N: Eu,Z, Ba—Si—O—N: Eu,Z,
Sr—Ba—Si—O—N: Eu,Z, Ca—Si—C—N: Eu,Z, Sr—Si—C—N: Eu,Z, Sr—Ca—Si—C—N: Eu,Z, Ca—Si—C—O—N: Eu,Z, Sr—Si—C—O—N: Eu,Z, Sr—Ca—Si—C—O—N: Eu,Z, Mg—Si—N: Eu,Z, Mg—Ca—Sr—Si—N: Eu,Z, Sr—Mg—Si—N:
Eu,Z, Mg—Si—O—N: Eu,Z, Mg—Ca—Sr—Si—O—N: Eu,Z, Sr—Mg—Si—O—N: Eu,Z, Ca—Zn—Si—C—N: Eu,Z, Sr—Zn—Si—C—N: Eu,Z, Sr—Ca—Zn—Si—C—N: Eu,Z, Ca—Zn—Si—C—C—N: Eu,Z, Sr—Zn—Si—C—C—N: Eu,Z, Sr—Ca—Zn—Si—C—C—N: Eu,Z, Mg—Zn—Si—N: Eu,Z, Mg—Ca—Zn—Sr—Si—N: Eu,Z, Sr—Zn—Mg—Si—N: Eu,Z, Mg—Zn—Si—O—N: Eu,Z, Mg—Ca—Zn—Sr—Si—O—N: Eu,Z, Sr—Mg—Zn—Si—O—N: Eu,Z, Ca—Zn—Si—Sn—C—N: Eu,Z, Sr—Zn—Si—Sn—C—N: Eu,Z, Sr—Ca—Zn—Si—Sn—C—N: Eu,Z, Ca—Zn—Si—Sn—C—C—N: Eu,Z, Sr—Zn—Si—Sn—C—C—N: Eu,Z, Sr—Ca—Zn—Si—Sn—C—O—N: Eu,Z, Mg—Zn—Si—Sn—N: Eu,Z, Mg—Ca—Sr—Si—Sn—N: Eu,Z, Sr—Zn—Mg—Si—Sn—N: Eu,Z, Mg—Zn—Si—Sn—O—N: Eu,Z, Mg—Ca—Zn—Sr—Si—Sn—O—N: Eu,Z and Sr—Mg—Zn—Si—Sn—O—N: Eu,Z. Z that represents a rare earth element preferably contains at least one selected from among Y, La, Ce, Pr, Nd, Tb, Dy, Ho, Er and Lu, but may also include Sc, Sm, Tm, Yb. These rare earth elements are mixed in the material either in the form of a simple substance or compounds such as oxide, imide or amide. While rare earth elements have a trivalent electron configuration, Yb, Sm and the like have a divalent electron configuration and Ce, Pr, Tb and the like have a quadrivalent electron configuration. When a rare earth element is used in the form of oxide, presence of oxygen affects light emission characteristics of the fluorescent material. In other words, presence of oxygen may cause a decrease in luminance of emitted light, although it provides an advantage of reducing duration of afterglow. Inclusion of Mn, on the other hand, increases a particle size and improves luminance of emitted light.

For example, La is used as a co-activation agent. Lanthanum oxide ($La_2O_3$) is a white crystalline material, which quickly turns into carbonate when left in air and is therefore kept in an inert gas atmosphere.

For example, Pr is used as a co-activation agent. Praseodymium oxide ($Pr_6O_{11}$) is a non-stoichiometrical compound, unlike ordinary oxides of rare earth elements $Z_2O_3$.

When oxalate, hydroxide, carbonate or other compounds of praseodymium is heated to 800° C. in air, a black powder having a composition of $Pr_6O_{11}$ is obtained. $Pr_6O_{11}$, that is used as a starting material for synthesizing a praseodymium compound, is commercially available with high purity.

The fluorescent material is a silicon nitride based on Sr—Ca—Si—N: Eu, Ca—Si—N: Eu, Sr—Si—N: Eu, Sr—Ca—Si—O—N: Eu, Ca—Si—O—N: Eu or Sr—Si—O—N: Eu containing Mn added thereto. A basic composition of this fluorescent material is represented by general formula $L_XSi_YN_{(2/3X+4/3Y)}$:Eu or $L_XSi_YO_ZN_{(2/3X+4/3Y-2/3Z)}$:Eu (L is one selected from among Sr, Ca and Sr plus Ca). Values of X and Y in the formula are preferably X=2 and Y=5 or X=1 and Y=7, but may be various other values. Specifically, fluorescent material having basic compositions $(Sr_xCa_{1-x})_2Si_5N_8$: Eu, $Sr_2Si_5N_8$: Eu, $Ca_2Si_5N_8$: Eu, $Sr_xCa_{1-x}Si_7N_{10}$: Eu, $SrSi_7N_{10}$: Eu or $CaSi_7N_{10}$: Eu containing Mn added thereto is preferably used. Fluorescent materials having basic compositions may include at least one element selected from among a group consisting of Mg, Sr, Ca, Ba, Zn, B, Al, Cu, Mn, Cr and Ni. The present invention is not limited to this embodiment and example. L is one selected from among Sr, Ca and Sr plus Ca. Proportions of Sr and Ca may be changed as required. A fluorescent material of low cost and good crystallinity can be made by containing Si in the composition.

Europium, Eu, which is a rare earth element is used as a luminescence center. Europium has main energy levels, divalent and trivalent. $Eu^{2+}$ is used as an activation agent for a fluorescent material based on alkaline earth metal silicon nitrate. $Eu^{2+}$ is easily oxidized and is commercialized in a trivalent form of $Eu_2O_3$. But when commercially available $Eu_2O_3$ is used, significant participation of O in a reaction makes it difficult to obtain a satisfactory fluorescent material. Therefore, it is preferable to remove O from $Eu_2O_3$. For example, it is preferable to use a simple substance of europium or europium nitride. This does not apply when Mn is added.

Examples of the fluorescent material which can be manufactured include, but are not limited to, $Sr_2Si_5N_8$: Eu,Pr, $Ba_2Si_5N_8$: Eu,Pr, $Mg_2Si_5N_8$: Eu,Pr, $Zn_2Si_5N_8$: Eu,Pr, $SrSi_7N_{10}$: Eu,Pr, $BaSi_7N_{10}$: Eu, Ce, $MgSi_7N_{10}$: Eu, Ce, $ZnSi_7N_{10}$: Eu, Ce, $Sr_2Ge_5N_8$: Eu, Ce, $Ba_2Ge_5N_8$: Eu,Pr, $Mg_2Ge_5N_8$: Eu,Pr, $Zn_2Ge_5N_8$: Eu,Pr, $SrGe_7N_{10}$: Eu, Ce, $BaGe_7N_{10}$: Eu,Pr, $MgGe_7N_{10}$: Eu,Pr, $ZnGe_7N_{10}$: Eu, Ce, $Sr_{1.8}Ca_{0.2}Si_5N_8$: Eu,Pr, $Ba_{1.8}Ca_{0.2}Si_5N_8$: Eu, Ce, $Mg_{1.8}Ca_{0.2}Si_5N_8$: Eu,Pr, $Zn_{1.8}Ca_{0.2}Si_5N_8$: Eu, Ce, $Sr_{0.8}Ca_{0.2}Si_7N_{10}$: Eu,La, $Ba_{0.8}Ca_{0.2}Si_7N_{10}$: Eu,La, $Mg_{0.8}Ca_{0.2}Si_7Nio$: Eu,Nd, $Zn_{0.8}Ca_{0.2}Si_7N_{10}$: Eu,Nd, $Sr_{0.8}Ca_{0.2}Ge_7N_{10}$: Eu,Tb, $Ba_{0.8}Ca_{0.2}Ge_7N_{10}$: Eu,Tb, $Mg_{0.8}Ca_{0.2}Ge_7N_{10}$: Eu,Pr, $Zn_{0.8}Ca_{0.2}Ge_7N_{10}$: Eu,Pr, $Sr_{0.8}Ca_{0.2}Si_6GeN_{10}$: Eu,Pr, $Ba_{0.8}Ca_{0.2}Si_6GeN_{10}$: Eu,Pr, $Mg_{0.8}Ca_{0.2}Si_6GeN_{10}$: Eu,Y, $Zn_{0.8}Ca_{0.2}Si_6GeN_{10}$: Eu,Y, $Sr_2Si_5N_8$: Pr, $Ba_2Si_5N_8$: Pr, $Sr_2Si_5NB$: Tb, $BaGe_7N_{10}$: Ce.

Addition of Mn accelerates diffusion of $Eu^{2+}$, and improves luminance of light emission, energy efficiency and efficiency of light emission such as quantum efficiency. Mn is either mixed in a stock material or supplied in the form of simple substance of Mn or an Mn compound in a manufacturing process and fired together with stock material. This fired material does not include Mn or, if it does, only a small fraction of that which was added. This is supposedly because Mn was dissipated during a firing process.

The fluorescent material contains at least one element selected from among a group consisting of Mg, Ga, In, Li, Na, K, Re, Mo, Fe, Sr, Ca, Ba, Zn, B, Al, Cu, Mn, Cr, O and Ni in a basic composition or in addition to the basic composition. These elements have such effects as increasing particle size and increasing luminance of light emission. B, Al, Mg, Cr and Ni have an effect of suppressing afterglow.

The nitride fluorescent material described above absorbs a part of blue light emitted by an LED chip and emits light in a yellow to red region. Thus, the present invention provides a light emitting device that uses the nitride fluorescent material and the YAG fluorescent material, and emits blended white light of a warm color tone by blending blue light emitted by an LED and light of a yellow to red color emitted by the nitride fluorescent material. In addition to the nitride fluorescent material, yttrium aluminum oxide fluorescent material activated with cerium is preferably included. Light color can be adjusted to a desired chromaticity when yttrium aluminum oxide fluorescent material is included. The Yttrium aluminum oxide fluorescent material activated with cerium absorbs a part of blue light emitted by the LED chip and emits yellow light. The blue light emitted by the LED chip and the yellow light emitted by the yttrium aluminum oxide fluorescent material are blended to produce bluish white light. Therefore, when the yttrium aluminum oxide fluorescent material and a fluorescent material that emits red light are mixed and included in the transparent coating material, and the blue light emitted by the LED chip is combined therewith, a light emitting device capable of emitting white light can be provided. Particularly preferable is a light emitting device that emits white light having a chromaticity curve of a black body on a chromaticity diagram. However, quantities of the yttrium aluminum oxide fluorescent material and the fluorescent material that emits red light may be changed to provide a light emitting device that emits light of a desired color temperature. The light emitting device that emits white light by blending is intended to improve special color rendering index R9. A conventional light emitting device that emits white light by simply combining a blue light emitting diode and a yttrium aluminum oxide fluorescent material activated with cerium has special color rendering index R9 that is almost 0 around color temperature Tcp=4600 K, and lacks a red component, thus giving rise to a demand for means to improve the special color rendering index R9. The present invention makes it possible to improve a value of special color rendering index R9 to about 40 around color temperature Tcp=4600 K by using a fluorescent material that emits red light along with the yttrium aluminum oxide fluorescent material.

Now a method of manufacturing $(Sr_xCa_{1-x})_2Si_5N_8$: Eu according to the present invention will be described below. It is understood that the present invention is not limited to this manufacturing method. The fluorescent material described above contains Mn and O.

First, stock materials Sr and Ca are crushed. While Sr and Ca are preferably supplied in the form of a simple substance, compounds such as imide compound or amide compound may also be used. The stock materials Sr and Ca may include B, Al, Cu, Mg, Mn, MnO, $Mn_2O_3$, or $Al_2O_3$. The stock materials Sr and Ca are crushed in a glove box in an argon atmosphere. A mean particle size of crushed Sr and Ca is preferably in a range from about 0.1 μm to 15 μm, but is not limited to this range. Purity of Sr and Ca is preferably at least 2N, but is not limited to this level. In order to better mix the materials, at least one of metal Ca, metal Sr and metal Eu may be alloyed and used as a stock material after nitriding and crushing.

Stock material Si is crushed. While Si is preferably supplied in the form of a simple substance, compounds such as nitride, imide compound or amide compound may also be used, for example, $Si_3N_4$, $Si(NH_2)_2$ or $Mg_2Si$. Purity of the stock material Si is preferably at least 3N, but such compounds may be included as $Al_2O_3$, Mg, metal borate ($CO_3B$, $Ni_3B$, CrB), manganese oxide, $H_2BO_3$, $B_2O_3$, $Cu_2O$ and CuO. Similarly to the stock materials Sr and Ca, stock material Si is also crushed in a glove box in argon atmosphere or nitrogen atmosphere. A mean particle size of the Si compound is preferably in a range from about 0.1 μm to 15 μm.

The stock materials Sr and Ca are nitrided in a nitrogen atmosphere. This reaction is represented by the following schemes 1 and 2.

$$3Sr+N_2 \rightarrow Sr_3N_2 \quad \text{[Scheme 1]}$$

$$3Ca+N_2 \rightarrow Ca_3N_2 \quad \text{[Scheme 2]}$$

Sr and Ca are nitrided in the nitrogen atmosphere at a temperature from 600 to 900° C. for 5 hours. Sr and Ca may be either mixed and nitrided together or nitrided separately.

Thus nitrides of Sr and Ca are obtained.

Nitrides of Sr and Ca are preferably of high purity, but commercialized material may also be used.

The stock material Si is nitrided in a nitrogen atmosphere. This reaction is represented by the following scheme 3.

$$3Si+2N_2 \rightarrow Si_3N_4 \quad \text{[Scheme 3]}$$

Silicon, Si, is also nitrided in the nitrogen atmosphere at a temperature from 800 to 1200° C. for 5 hours, thereby to obtain silicon nitride. Silicon nitride used in the present invention is preferably of high purity, but commercialized material may also be used.

Nitrides of Sr and Ca, or a nitride of Sr—Ca, is crushed in a glove box in an argon atmosphere or nitrogen atmosphere.

Nitride of Si is crushed similarly. A compound of Eu, $Eu_2O_3$, is also crushed similarly. While europium oxide is used as the compound of Eu, metal europium or europium nitride may also be used. In addition, imide compound or amide compound may be used as material Z. Europium oxide is preferably of high purity, but commercialized material may also be used. Mean particle sizes of a nitride of alkaline earth metal, silicon nitride and europium oxide after crushing are preferably in a range from about 0.1 μm to 15 μm.

The materials described above may include at least one element selected from among a group consisting of Mg, Sr, Ca, Ba, Zn, B, Al, Cu, Mn, Cr, O and Ni. The elements described above such as Mg, Zn an B may be mixed while controlling proportions in a mixing process described below. While these elements may be added into the stock material individually, they are usually added in the form of compounds such as $H_2BO_3$, $Cu_2O_3$, $MgCl_2$, MgO.CaO, $Al_2O_3$, metal boride (CrB, $Mg_3B_2$, $AlB_2$, MnB), $B_2O_3$, $Cu_2O$ and CuO.

After crushing processes described above, nitrides of Sr and Ca, or nitride of Sr—Ca, nitride of Si and $Eu_2O_3$ are mixed, and Mn is added thereto. Since this mixture is easily oxidized, these nitrides are mixed in a glove box in an Ar atmosphere or nitrogen atmosphere.

Last, the mixture of nitrides of Sr and Ca, or nitride of Sr—Ca, nitride of Si and $Eu_2O_3$ are fired in an ammonium atmosphere, thus making a fluorescent material having a composition of $(Sr_xCa_{1-x})_2Si_5N_8$: Eu with Mn added thereto. Composition of the fluorescent material can be changed by changing proportions of mixing the materials.

Firing can be performed in a tubular furnace, compact furnace, induction furnace or metal furnace. While firing is performed in a temperature range from 1200 to 1700° C., the temperature is more preferably from 1400 to 1700° C. Firing is preferably performed in a single stage where the temperature is gradually raised and held in a range from 1200 to 1500° C. for several hours, 2-stage firing (multi-stage firing) may also be employed wherein a first firing is performed in a temperature range from 800 to 1000° C., then the temperature is gradually raised and held in a range from 1200 to 1500° C. for firing. A material to make the fluorescent material is preferably fired in a crucible or boat made of boron nitride (BN). Besides a crucible made of boron nitride, a crucible made of alumina ($Al_2O_3$) may also be used.

A desired fluorescent material can be obtained through a manufacturing method described above.

While nitride fluorescent material is used as the fluorescent material that emits reddish light, the present invention can provide a light emitting device comprising the YAG fluorescent material described above and a fluorescent material capable of emitting red light. The fluorescent material capable of emitting red light is a fluorescent material that is excited by light of wavelengths from 400 to 600 nm, for example $Y_2O_2S$: Eu, $La_2O_2S$: Eu, CaS: Eu, SrS: Eu, ZnS: Mn, ZnCdS: Ag, Al, ZnCdS: Cu, Al. A color rendering property of the light emitting device can be improved by using the YAG fluorescent material and the fluorescent material capable of emitting red light.

The fluorescent material capable of emitting red light represented by an aluminum garnet fluorescent material and nitride fluorescent material formed as described above may be provided either in a plurality of kinds in a wavelength converting member constituted from a single layer on the surface of the light emitting device, or in a single kind or a plurality of kinds in the wavelength converting member constituted from two layers. This constitution makes it possible to obtain white light through blending of light emitted by different fluorescent materials. In this case, it is preferable that the fluorescent materials have similar mean particle sizes and shapes in order to achieve satisfactory blending of the light emitted by the different fluorescent materials and minimize color unevenness. It is preferable to constitute the wavelength converting member such that the nitride fluorescent material is disposed nearer to the light emitting element than is the YAG fluorescent material, in consideration of the fact that the nitride fluorescent material absorbs a part of light that has undergone wavelength conversion by the YAG fluorescent material. This constitution prevents such a problem that the nitride fluorescent material absorbs a part of light that has undergone wavelength conversion by the YAG fluorescent material, and makes it possible to improve a color rendering property of blended light compared to a case where the YAG fluorescent material and the nitride fluorescent material are mixed.

(Alkaline Earth Metal Salt)

The light emitting device may be provided with alkaline earth metal silicate activated with europium as fluorescent material that absorbs a part of light emitted by the light emitting element and emits light of a wavelength different from that of this absorbed light. The alkaline earth metal silicate is preferably ortho-silicate of alkaline earth metal represented by the following general formula.

(2−x−y)SrO.x(Ba, Ca)O.(1−a−b−c−d)
$SiO_2$.a$P_2O_5$b$Al_2O_3$c$B_2O_3$d$GeO_2$:y $Eu^{2+}$ (where
0<x1.6, 0.005<y<0.5, 0<a, b, c, d<0.5)

(2−x−y)BaO.x(Sr, Ca)O.(1−a−b−c−d)
$SiO_2$.a$P_2O_5$b$Al_2O_3$c$B_2O_3$d$GeO_2$:y $Eu^{2+}$ (where
0<x1.6, 0.005<y<0.5, 0<a, b, c, d<0.5)

It is preferable that at least one of a, b, c and d is larger than 0.01.

As the fluorescent material made of alkaline earth metal salt, alkaline earth metal aluminate, Y(V, P, Si)O$_4$: Eu or alkaline earth metal-magnesium-dicilicate may be used, instead of the alkaline earth metal silicate described above.

Me(3−x−y)MgSi$_2$O$_3$:xEu, yMn (where 0.005<x<0.5, 0.005<y<0.5, Me is Ba and/or Sr and/or Ca.)

Now a process of manufacturing the fluorescent material made of alkaline earth metal silicate according to this embodiment will be described below.

For manufacture of alkaline earth metal silicate, alkaline earth metal carbonate, silicon dioxide and europium oxide are mixed in stoichiometrical proportions as starting materials in accordance with a selected composition, and are transformed into a desired fluorescent material at temperatures of 1100° C. and 1400° C., in a reducing atmosphere through reactions of solid materials ordinarily employed in the manufacture of fluorescent materials. In this process, it is preferable to add less than 0.2 moles of ammonium chloride or other halogenide. A part of silicon may be substituted by germanium, boron, aluminum or phosphorus as required, and a part of europium may be substituted by manganese.

By combining the fluorescent materials described above, namely alkaline earth metal aluminate activated with europium and/or manganese, Y(V, P, Si)O$_4$:Eu or Y$_2$O$_2$S:Eu$^{3+}$, emission of light having a desired color temperature and high color reproducibility can be achieved, as shown in Table 1.

(4) BaMg$_2$Al$_{16}$O$_{27}$: Eu, Mn (5) 3.5MgO.0.5MgF$_2$.GeO$_2$: Mn (6) Y$_2$O$_2$S: Eu (7) Mg$_6$As$_2$O$_{11}$: Mn (8) Sr$_4$Al$_{14}$O$_{25}$: Eu (9) (Zn, Cd)S: Cu

(10) SrAl$_2$O$_4$: Eu

(11) Ca$_{10}$(PO$_4$)$_6$ClBr: Mn, Eu

(12) Zn$_2$GeO$_4$: Mn

(13) Gd$_2$O$_2$S: Eu, and

(14) La$_2$O$_2$S: Eu

These fluorescent materials may be used either individually or in a mixture thereof in a wavelength converting member constituted from a single layer, or individually or in a mixture thereof in a wavelength converting member constituted from at least two layers.

[Electrically conductive wire 104]

Connection between the electric wiring 105 formed in the recess of the package and the electrodes of the LED chip 103 can be made by disposing the electrodes of the LED chip 103 to oppose the electric wiring 105 via electrically conductive wires or electrically conductive members. Each electrically conductive wire 104 is a kind of electrical connecting member that connects the electrodes of the LED chip 103 and the electric wiring 105 formed in the ceramic

TABLE 1

| Example | Fluorescent material | Excitation wavelength [nm] | Chromaticity coordinate x | Chromaticity coordinate y | Color temperature [K] | Color rendering property Ra |
|---|---|---|---|---|---|---|
| 1 | Sr$_{1.4}$Ba$_{0.6}$SiO$_4$ : Eu$^{2+}$ | 464 | 0.4619 | 0.4247 | 2778 | 72 |
| 2 | Sr$_{1.4}$Ba$_{0.6}$SiO$_4$ : Eu$^{2+}$ | 464 | 0.4380 | 0.4004 | 2950 | 73 |
| 3 | Sr$_{1.6}$Ba$_{0.4}$SiO$_4$ : Eu$^{2+}$ | 464 | 0.4086 | 0.3996 | 3497 | 74 |
| 4 | Sr$_{1.9}$Ba$_{0.08}$Ca$_{0.02}$SiO$_4$ : Eu$^{2+}$ | 464 | 0.3762 | 0.3873 | 4183 | 75 |
| 5 | Sr$_{1.9}$Ba$_{0.02}$Ca$_{0.08}$SiO$_4$ : Eu$^{2+}$ | 464 | 0.3101 | 0.3306 | 6624 | 76 |
| 6 | Sr$_{1.6}$Ba$_{0.4}$SiO$_4$ : Eu$^{2+}$<br>Sr$_{0.4}$Ba$_{1.6}$SiO$_4$ : Eu$^{2+}$ | 464 | 0.3135 | 0.3397 | 6385 | 82 |
| 7 | Sr$_{1.9}$Ba$_{0.08}$Ca$_{0.02}$SiO$_4$ : Eu$^{2+}$ | 464 | 0.3710 | 0.3696 | 4216 | 82 |
| 8 | Sr$_{1.6}$Ba$_{0.4}$SiO$_4$ : Eu$^{2+}$<br>Sr$_{0.4}$Ba$_{1.6}$SiO$_4$ : Eu$^{2+}$<br>YVO$_4$ : Eu$^{3+}$ | 464 | 0.3756 | 0.3816 | 3954 | 84 |
| 9 | Sr$_{1.6}$Ba$_{0.4}$SiO$_4$ : Eu$^{2+}$<br>Sr$_{0.4}$Ba$_{1.6}$SiO$_4$ : Eu$^{2+}$<br>Barium magnesium aluminate : Eu$^{2+}$ | 464 | 0.3115 | 0.3390 | 6489 | 66 |
| 10 | Sr$_{1.6}$Ba$_{0.4}$(Si$_{0.08}$B$_{0.02}$)O$_4$ : Eu$^{2+}$<br>Sr$_{0.6}$Ba$_{1.4}$SiO$_4$ : Eu$^{2+}$ | 464 | 0.3423 | 0.3485 | 5097 | 82 |
| 11 | Sr$_{1.6}$Ba$_{0.4}$(Si$_{0.08}$B$_{0.02}$)O$_4$ : Eu$^{2+}$<br>Sr$_{0.6}$Ba$_{1.4}$SiO$_4$ : Eu$^{2+}$<br>Strontium magnesium aluminate : Eu$^{2+}$ | 464 | 0.3430 | 0.3531 | 5084 | 83 |
| 12 | Sr$_{1.4}$Ba$_{0.6}$Si$_{0.95}$Ge$_{0.05}$O$_4$ : Eu$^{2+}$ | 464 | 0.4134 | 0.3959 | 3369 | 74 |
| 13 | Sr$_{1.4}$Ba$_{0.6}$Si$_{0.98}$P$_{0.02}$O$_{4.01}$ : Eu$^{2+}$ | 466 | 0.4630 | 0.4280 | 2787 | 72 |
| 14 | Sr$_{1.4}$Ba$_{0.6}$Si$_{0.98}$Al$_{0.02}$O$_4$ : Eu$^{2+}$ | 464 | 0.4425 | 0.4050 | 2913 | 73 |

(Other Fluorescent Materials)

In this embodiment, fluorescent materials that are excited by ultraviolet rays and emit light of a predetermined color may also be used such as listed below.

(1) Ca$_{10}$(PO$_4$)$_6$FCl: Sb, Mn (2) M$_5$(PO$_4$)$_3$Cl: Eu (where M represents at least one kind of element selected from among Sr, Ca, Ba and Mg)

(3) BaMg$_2$Al$_{16}$O$_{27}$: Eu package, and is required to have a good ohmic property, good mechanical connection, high electrical conductivity and high thermal conductivity. Thermal conductivity is preferably at least 0.01 cal/cm$^2$/cm/° C., and more preferably at least 0.5 cal/cm$^2$/cm/° C. A diameter of the electrically conductive wire is preferably in a range from 10 μm to 45 μm, in consideration of workability. The electrically conductive wire may be made of such metal as gold, copper, platinum or aluminum, or an alloy thereof. Such an electrically conductive wire can connect electrodes of an LED chip and electric wiring formed on a substrate easily by use of a wiring bonding tool. Now examples of the present invention will be described in detail below. It should be noted that the present invention is not limited to these examples.

EXAMPLE 1

Example 1 of the present invention will be described with reference to the accompanying drawings. FIG. 1A is a schematic top view of a light emitting device 100 that uses a ceramic package and light emitting element according to this embodiment. FIG. 2 is shows a sectional view taken along lines I-I in FIG. 1A and an enlarged sectional view of a portion around a top face of a recess side wall. FIG. 1B is a perspective view schematically showing a semiconductor device of this embodiment being electrically and mechanically connected by soldering to a mounting surface where a wiring pattern has been formed.

The ceramic package of this embodiment comprises at least a ceramic base 202 serving as a substrate, and a ceramic base 204 having a through hole that widens toward an opening. The ceramic base 202 that serves as the substrate has electrical wiring 105 for supplying power to LED chip 103 running from a bottom of the recess on the package through the ceramic bases 202, 203 to extend to an outer surface of the light emitting device. The electrical wiring 105 is exposed in the recess on the package, and electrical wiring 106 is exposed on a cleavage surface of the ceramic substrate. The electrical wiring 106, that is exposed to extend over an outer surface of the light emitting device, is connected to an electrical circuit provided on a mounting substrate when the light emitting device is mounted so that a side face adjacent to the light emitting surface is disposed to oppose the mounting substrate. An inner wall surface of the ceramic base 204 that expands toward the opening forms the recess of the package, with reflecting surface 102 formed thereon. The light emitting device of this embodiment further has a sealing member that seals the recess of the ceramic package. The electrical wiring 105 and the reflecting surface 102 comprise a resin paste (about 30000 ps in viscosity) containing tungsten (mean particle size about 1 μm) and coated with Ag. LED chip 103 is secured with an insulating adhesive on a surface of the electrical wiring 105 provided on the bottom of the recess in the package.

Now formation of the ceramic package of this embodiment will be described below. First, a green sheet made mainly of alumina is cut into a predetermined size, to make a precursor of the ceramic base 202. A resin paste containing tungsten is screen-printed in a pattern of the electrical wiring 105.

A green sheet having a through hole of a size sufficient to accommodate an LED chip, and a green sheet having a through hole expanding toward one opening, are formed. A resin paste containing tungsten is screen-printed in the shape of a reflecting surface 102 on the green sheets, to make precursors of the ceramic base 204.

Green sheets formed as described above are placed one on another while aligning the through holes, and are processed by heat pressing in a vacuum to form the recess.

Through holes 0.3 mm in diameter are formed by an ordinary method using a punching machine. The through holes are formed at least in a pair and, in this embodiment, two through holes are formed for each of positive and negative electrodes. The through holes are then filled with the resin paste containing tungsten by screen printing, so as to form the electrical wiring 106 exposed on the outer surface of the ceramic package.

Scribe lines are formed in a predetermined pattern on one of principal surfaces of this green sheet stack. Grooves are formed in a shape of a matrix so that the recess is included between grooves formed in a longitudinal direction and the groove formed in the lateral direction of the ceramic substrate. After forming the grooves, this ceramic stack is sintered to made the ceramic substrate. The paste containing tungsten is turned into a first metal layer by sintering. Then, an exposed surface of the first metal layer is covered by an Ni/Ag multi-layer film that becomes a second metal layer by plating. Thus, the reflecting surface 102 and the electrical wirings 105, 106 are formed to complete the ceramic substrate having a recess 2.0 mm in diameter and 0.8 mm in depth.

An LED that is a semiconductor light emitting element is made of an InGaN semiconductor with a main emission peak at a wavelength 450 nm. The LED chip is made by forming a gallium nitride semiconductor by an MOCVD method while flowing TMG (trimethyl gallium) gas, TMI (trimethyl indium) gas, nitrogen gas and dopant gas together with a carrier gas over a cleaned sapphire substrate. A PN junction of a gallium nitride semiconductor having N-type conductivity and a gallium nitride semiconductor having P-type conductivity is formed by switching between $SiH_4$ and $Cp_2Mg$ to be flowed as the dopant gas. The P-type semiconductor is annealed at a temperature of at least 400° C. after forming the layer.

After exposing the P-type and N-type semiconductors by etching, electrodes are formed by sputtering. A semiconductor wafer thus made is scribed to form lines along which the wafer is cleaved by an external force and separated into LED chips. An LED chip capable of emitting blue light is die-bonded onto the bottom of the recess of the ceramic package with epoxy resin that is then heated to harden. Then, electrodes of the LED chip and electrical wirings are electrically connected by wire bonding using electrically conductive wires made of gold. The recess in the ceramic substrate, wherein the LED chip is mounted, is filled with silicone resin to form a sealing member. The silicon resin is poured up to near a top face of the recess side wall of the ceramic package and is hardened. Part of the silicone resin either impregnates the side wall of the recess or creeps up to the top surface before being hardened. For example, the silicone resin is concentrated around the recess viewed from a light emission observing side, and a part of the silicone resin extends to a ceramic portion on the top face of a recess side wall as shown in FIG. 2. An extended portion, while it depends on viscosity of the silicone resin and on an extent to which the ceramic is sintered, creeps from the recess to the top face of the recess side wall as indicated by extended portion Y in the enlarged sectional view of FIG. 2. A part of the silicone resin also impregnates a porous ceramic that constitutes the side wall. This impregnated portion is indicated by impregnated portion X in the enlarged sectional view of FIG. 2, although it depends on viscosity of the silicone resin and on an extent to which the ceramic is sintered.

Figure 3A:
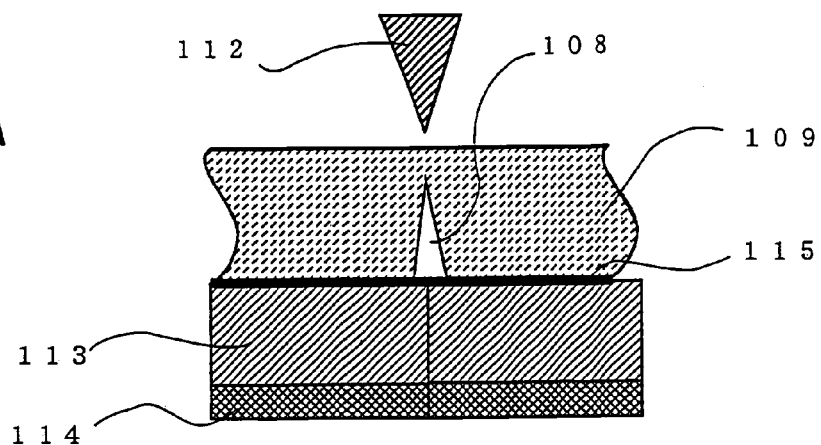
FIG. 3A is a side view schematically showing manufacturing process step 1 of the present invention.
Figure 3B:
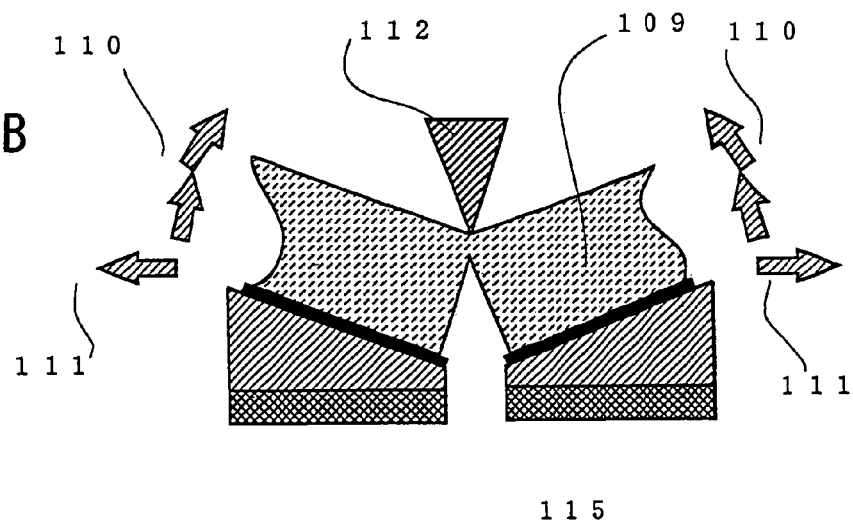
FIG. 3B is a side view schematically showing manufacturing process step 2 of the present invention.
Figure 3C:
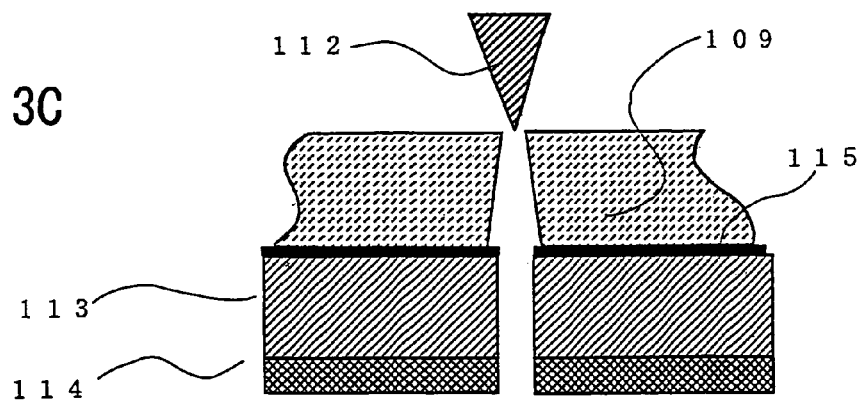
FIG. 3C is a side view schematically showing manufacturing process step 3 of the present invention.

FIG. 3A through FIG. 3C are side views schematically showing processes of manufacturing the ceramic package according to this embodiment. A bending moment is applied to the fired stack of green sheets (ceramic substrate) around a point on a surface opposite to the groove, while applying a tensile force in a direction parallel to a principal surface, thereby separating the ceramic substrate. This enables the substrate to be cleaved along a shortest path from the groove to a back surface, thereby minimizing generation of burrs and chippings. In the present invention, since the tensile force is applied simultaneously with the bending moment, mating cleavage surfaces hardly rub against each other. While a ceramic can be broken with only a tensile force, this requires a great magnitude of force, so that it becomes necessary to make grooves deeper or sandwich the ceramic substrate. Forming the grooves deeper leads to such trouble as cracking during polishing in a carrying step or working step. Sandwiching the ceramic substrate may also roughen a surface of a sandwiched portion. Although the ceramic substrate can be cleaved by applying the bending moment only, mating cleavage surfaces rub against each other thereto making it more likely that chipping and breakage occur in the cleavage surfaces. Also, because the ceramic substrate is cleaved in a portion where it is easier to break, it becomes easier for burrs to occur.

Now, a method of forming the ceramic package according to this embodiment will be described in detail below. As shown in FIG. 3A, a pair of stages 114 which can move in directions opposite to each other are disposed to oppose each other. Then, ceramic substrate 109 is disposed to bridge the pair of stages 114 so that groove 108 is located at a portion where the pair of stages 114 oppose each other. Last, as shown in FIG. 3B, a cleavage tool 112 is pressed against the substrate at a position corresponding to the groove, and the pair of stages 114 are moved in opposite directions (in a direction in which a tensile force is exerted).

The ceramic substrate is separated first in a longitudinal direction of the ceramic package, then in a lateral direction, thereby separating into individual ceramic packages. (At this time, the ceramic substrate 109 is preferably covered with an adhesive sheet 115 on a side thereof where the groove and the recess are formed. This makes it possible to prevent ceramic dust generated during this cleaving process from depositing onto sealing member made of silicone resin, and improve bonding of elastic body 113 with the ceramic substrate 109.) The ceramic substrate 109 is placed on the elastic body 113 via the adhesive sheet 115. This configuration improves bonding between the elastic body 113 and the ceramic substrate 109 during the cleaving process. At the same time, the ceramic substrate 109 is placed on the stage 114 via the elastic body 113. With this configuration, the elastic body 113 deforms when the cleaving tool 112 is applied, and bending moment 110 is applied when the cleaving tool 112 is pressed against the substrate toward the groove.

Cleaving the substrate as described above makes it possible to form a light emitting device without causing chipping or burrs in a cleavage surface. The light emitting device of this embodiment can be used as a sideways emission type light emitting device utilizing the cleavage surface of the ceramic package as a mounting surface for an external circuit board, thus making it possible to cause light to enter an optical guide plate without variations in mounting accuracy.

As shown in FIG. 1B, the light emitting device 100 of this embodiment is electrically and mechanically connected by solder 116 to mounting surface 117 of a substrate provided with an electrical circuit.

The silicone resin impregnates the ceramic base 205 that constitutes the principal surface on a light emission observing side of the ceramic package, or extends from the recess. The solder applied on the mounting surface 117 during a reflow process is restricted from creeping up toward the light emitting surface by the silicone resin provided on the principal surface on the light emission observing side, so that such trouble does not occur as solder lines contacting each other or the solder covering the opening of the recess of the ceramic package. Thus, the light emitting device 100 of this example can be connected to an external circuit board with high reliability.

EXAMPLE 2

FIG. 8 is a schematic sectional view of a light emitting device of this example. Sealing member 107 of this example is formed so as to cover at least light emitting element 103 without covering reflecting surface 102. As indicated by Y in the enlarged sectional view of FIG. 8, silicone resin covers a top face of a recess side wall of a ceramic package. In addition, a part of the silicone resin impregnates ceramic base 204 that forms the top face of the recess side wall and forms an impregnated portion X. In this example, since solder is restricted from creeping up by the silicone resin that covers the top face of the recess side wall, solder that has been reflowed never touches the reflecting surface 102. Therefore, mounting can be performed with high reliability as short-circuiting does not occur between positive and negative electrodes when mounting the device on an external circuit board that has an electrical circuit formed thereon.

EXAMPLE 3

A light emitting device of this example is formed similarly to Examples 1 and 2, except for containing fluorescent material in the sealing member.

Stock material for the fluorescent material is made by coprecipitating a solution of a mixture of rare earth elements Y, Gd, Ce in stoichiometrical proportions dissolved in an acid with oxalic acid, firing a product of this coprecipitation to obtain a coprecipitated oxide, and mixing this oxide with aluminum oxide. This mixture, with a fluoride such as ammonium fluoride added thereto as a flux, is put into a crucible and fired at a temperature of about 1400° C. in air for three hours. This fired mixture is crushed in a ball mill in a wet process, and undergoes processes of washing, separation, drying and sieving, thereby obtaining a fluorescent material $(Y_{0.995}Gd_{0.005})_{2.750}Al_5O_{12}$: $Ce_{0.250}$ having median particle size of 8 μm.

5.5% by weight of a fluorescent material (refractive index 1.84) is added to the silicone resin composition (refractive index 1.53) and mixed for about five minutes. A thermosetting material thus obtained is put into a recess of a ceramic package to fill in. Last, a heat treatment is applied at 70° C. for 2 hours and at 150° C. for 1 hour. This makes it possible to provide a light emitting device that can blend light emitted by the light emitting element and light emitted by the fluorescent material that absorbs the light emitted by the light emitting element and emits light of different wavelength. Particularly, by containing the fluorescent material in the sealing member 107 of Example 2, reflecting surface 102 can reflect this blended light efficiently toward a light emission observing side.

EXAMPLE 4

FIG. 5 is a top view of a ceramic package of this example. The ceramic package of this example has a recess for mounting a light emitting element therein. A pair of positive and negative leads 107a, 107b are provided in a bottom of the recess, where ceramic base 206 is exposed so as to isolate the pair of positive and negative leads 107a, 107b. A semiconductor element is placed at a center of the bottom of the recess where ceramic is exposed, while part of electrical wire 107a is formed so as to surround the semiconductor element. In case a transparent substrate side of the semiconductor light emitting element, that is made by stacking the semiconductor on a transparent substrate such as a sapphire substrate, is mounted to oppose the bottom of the recess, the transparent substrate is preferably covered with a metal that has high reflectivity to light such as Al, Ag or an alloy thereof. This constitution makes it possible to reflect light that would otherwise be transmitted through the ceramic toward the light emission observing side, thereby improving efficiency of extracting light from the light emitting device. Another semiconductor element such as a protective element may also be mounted on the electrical wire 107*a*. Exposed on a side face of the ceramic package is a pair of positive and negative leads 108*a*, 108*b* that are connected to the pair of positive and negative leads 107*a*, 107*b*. In ceramic package 200 of this example, unlike the examples described above, a ceramic substrate having a through hole of a smaller diameter is located at an outermost position of a recess side wall. Therefore, although the ceramic package of this example has the reflecting surface on the inner surface of the recess that expands toward the opening similarly to the examples described above, it cannot be seen in the top view of FIG. 5. In addition, a pair of marks 207 indicates that the cathode position is printed on a corner of a principal surface on the light emission observing side of the ceramic package of this example. The pair of marks 207 that indicate the cathode position can be formed by printing a resin paste containing tungsten on a ceramic green sheet and firing this sheet.

EXAMPLE 5

Figure 6:
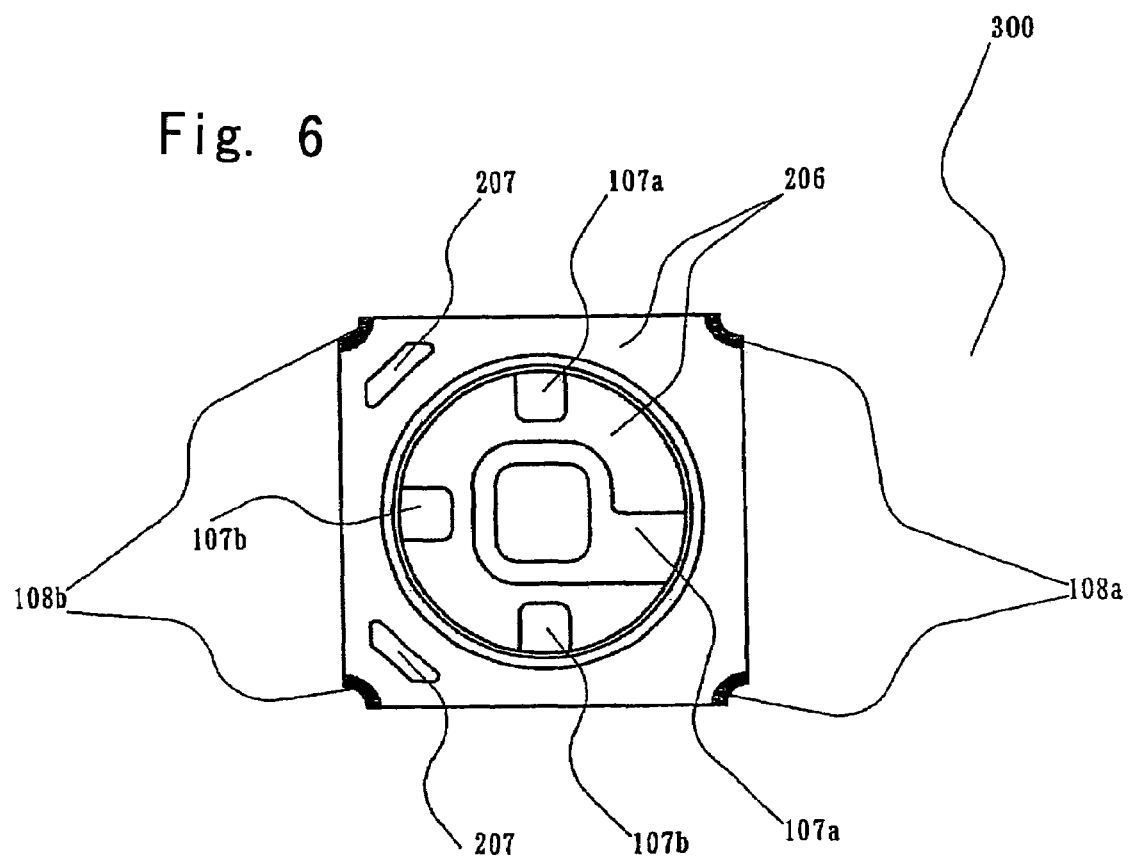
FIG. 6 is a schematic top view showing one example of a package of the present invention.

FIG. 6 is a top view of a ceramic package of this example. The ceramic package of this example is similar to that of Example 3 except for a different pattern of electrical wiring provided on a bottom of the recess. Specifically, positive and negative leads 107*a*, 107*b* are formed in two pairs so as to oppose each other when viewed from a light emission observing side. A semiconductor element is placed at a center of the bottom of the recess where ceramic is exposed, while part of an electrical wire is formed so as to surround the semiconductor element. An area of ceramic base 206 that is exposed between the positive and negative leads 107*a*, 107*b* is made larger than that in Example 3. Strength of adhesion is higher between the ceramic and a sealing member than between the electrically conductive wire and the sealing member. Therefore, constitution of this example makes it possible to improve strength of adhesion between the ceramic package and the sealing member, so as to provide a semiconductor device having high reliability where the sealing member does not peel off.

EXAMPLE 6

Figure 7:
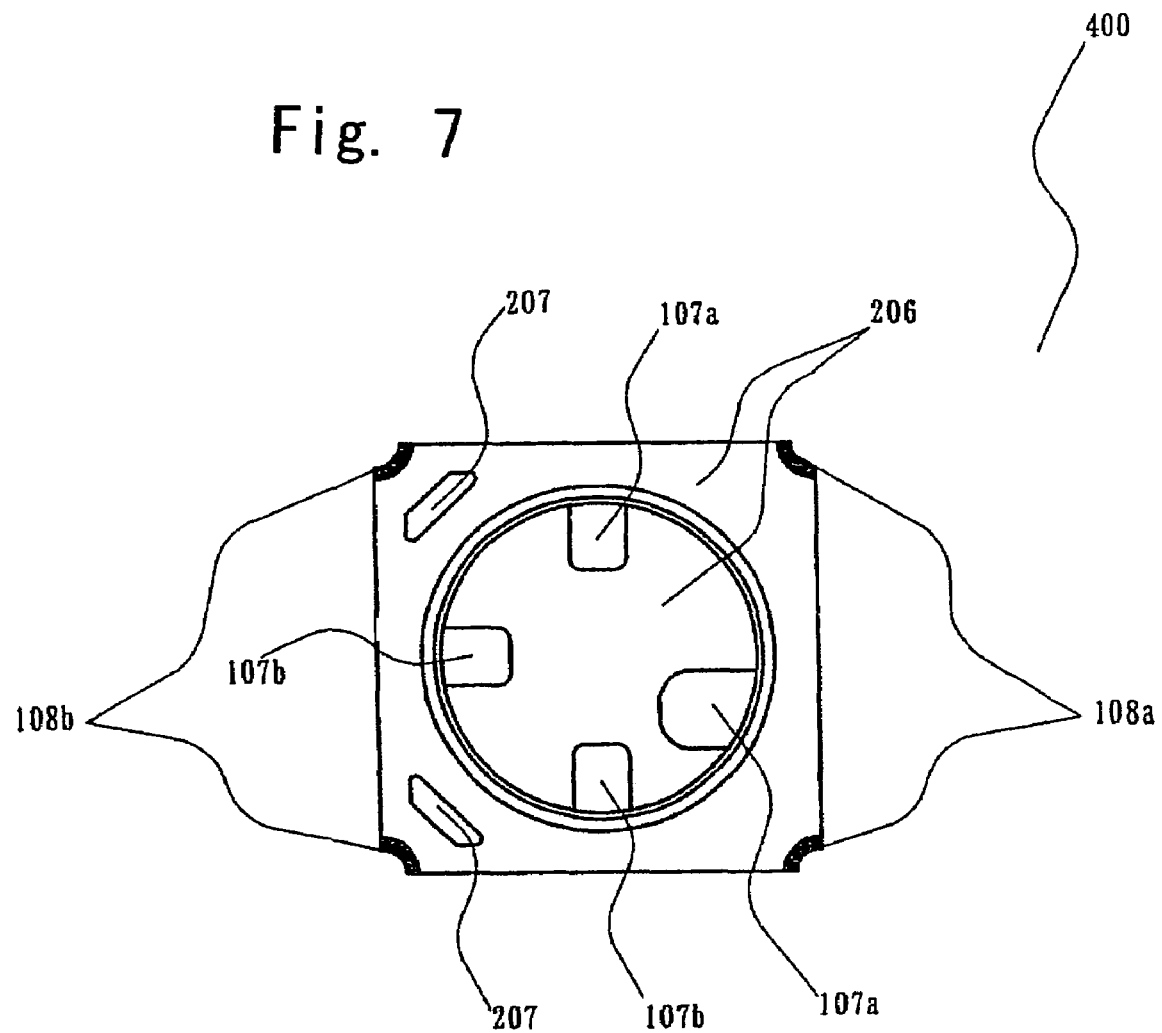
FIG. 7 is a schematic top view showing one example of a package of the present invention.

FIG. 7 is a top view of a ceramic package of this example. The ceramic package of this example is similar to those of Examples 3 and 4 except for a different pattern of electrical wiring provided on a bottom of the recess. Specifically, positive and negative leads 107*a*, 107*b* are formed in two pairs so as to oppose each other when viewed from a light emission observing side. An area of ceramic base 206 that is exposed between the positive and negative leads 107*a*, 107*b* is made larger than that in Example 4. A constitution of this example, in addition to effects of the present invention described above, further improves strength of adhesion between the ceramic package and sealing member than in the case of Example 4, so as to provide a semiconductor device having high reliability where the sealing member does not peel off.

COMPARATIVE EXAMPLE

Figure 10A:
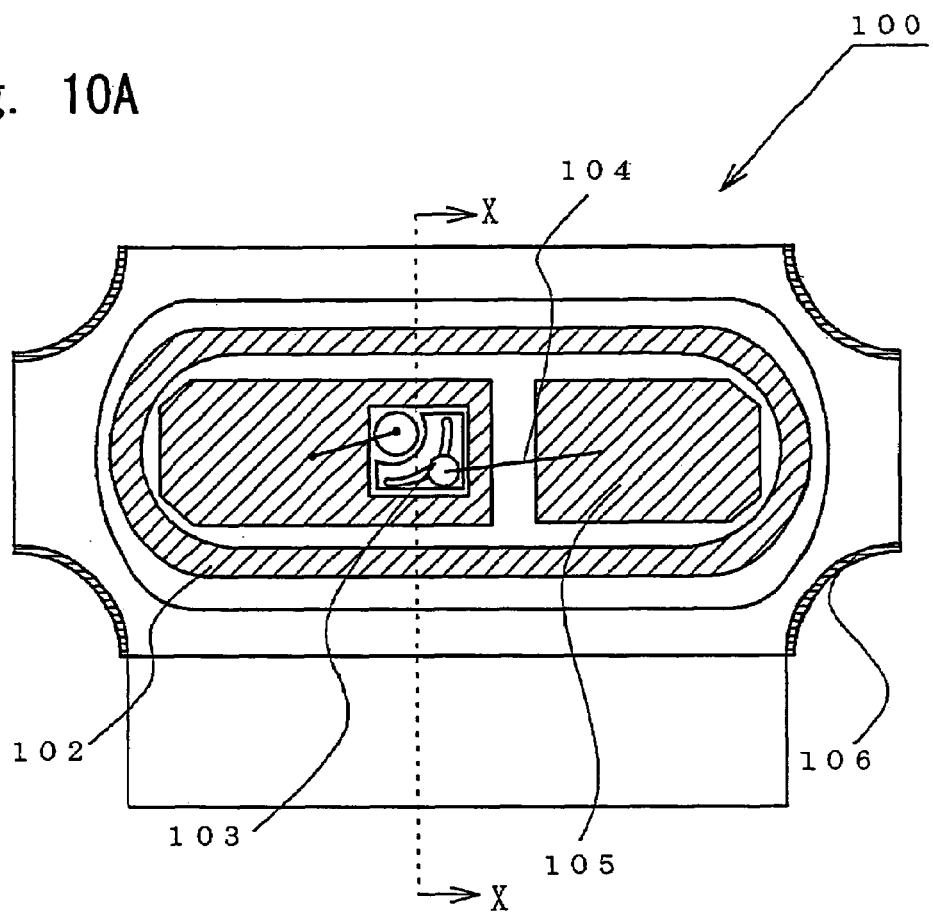
FIG. 10A is a top view of a ceramic package of this example.
Figure 10B:
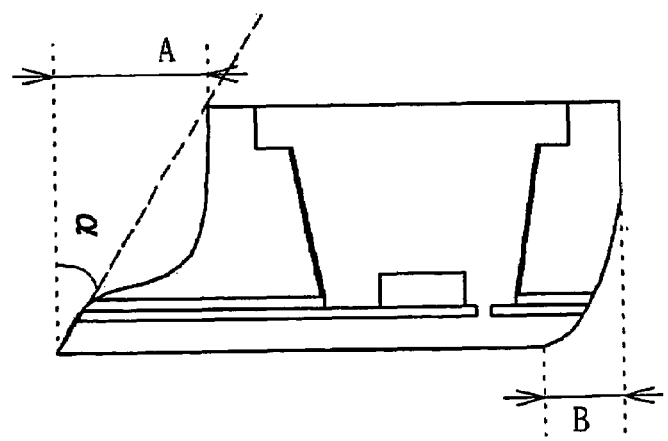
FIG. 10B is a sectional view taken along line X-X in FIG. 10A.

FIG. 10A is a top view of a ceramic package of this example. FIG. 10B is a sectional view taken along line X-X in FIG. 10A. In the ceramic package of this comparative example, grooves are formed by incising the ceramic substrate to a depth of ½ of a thickness of the ceramic substrate. A bending moment is applied from a side opposite to a side where the grooves are formed. A number of pieces have a cleaved face as shown in FIG. 10A. The portion cleaved vertically that has a protruded portion protruding out from a vertical face extending vertically from a incised portion toward an opposite side to a side to be mounted with a semiconductor element is more than half of the thickness of the ceramic substrate. In a sideways emission type light emitting device in which this support body is used, a tilt on mounting is more than 30 degrees since protruded portion A is larger than half of the thickness of the ceramic substrate. With this, emitting angles vary for each product and defective products are produced.

Contrasted with this, since dent portion B does not affect tilt on mounting, a denting depth may be more than half of the thickness of the ceramic substrate. If a mounting surface has a dent portion B, there is no problem because tilt on mounting is not affected. However, productivity is degraded extremely, since a cleaved surface of the ceramic package which was adjacent before cleaving has the protruded portion A which would fit to the dent portion B. Therefore, from a viewpoint of productivity, a production method according to present invention is preferably used so that a depth of the dent portion is half of a thickness of a ceramic substrate or smaller, preferably a quarter of the thickness of the ceramics substrate, more preferably at most ⅒ of the thickness of the ceramic substrate.

The ceramic package of the present invention can be used as a support body for a semiconductor device that comprises a light emitting element or a light receiving element. The light emitting device that employs the ceramic package of the present invention can be used as a sideways emission type light emitting device.

The invention claimed is:

1. A method of manufacturing a support body capable of supporting a semiconductor element, comprising:
   making a ceramic substrate by stacking ceramic sheets having electrical conductors thereon;
   forming a groove in a surface of said ceramic substrate;
   disposing said ceramic substrate on two stages, which can move in opposite directions relative to each other, so as to bridge said two stages; and
   cleaving said ceramic substrate along said groove by applying a bending moment to said ceramic substrate.

2. The method according to claim 1, wherein
   forming a groove in a surface of said ceramic substrate comprises incising said ceramic substrate.

3. The method according to claim 2, wherein
   applying a bending moment to said ceramic substrate comprises bringing a cleaving tool into contact with a surface of said ceramic substrate, opposite to said surface having said groove therein, at a position corresponding to said groove.

4. The method according to claim 3, wherein
   cleaving said ceramic substrate further comprises moving said two stages in said opposite directions while said cleaving tool is in contact with said surface of said ceramic substrate that is opposite to said surface having said groove therein.

5. The method according to claim 4, wherein each of said two stages includes an elastic body such that bringing said cleaving tool into contact with said surface of said ceramic substrate that is opposite to said surface having said groove therein results in each said elastic body deforming.

6. The method according to claim 5, further comprising: adhesively joining said ceramic substrate to said each said elastic body via an adhesive sheet positioned between said each said elastic body and said surface of said ceramic substrate having said groove therein.

7. The method according to claim 2, wherein applying a bending moment to said ceramic substrate comprises applying said bending moment such that said surface of said ceramic substrate having said groove therein becomes concave, whereby side walls defining said groove contact one another.

8. The method according to claim 2, wherein said groove is one of lateral and longitudinal grooves in a front surface of said ceramic substrate, with through holes being at intersections of said lateral and longitudinal grooves.

9. The method according to claim 2, wherein said groove extends along through holes in said ceramic substrate.

10. The method according to claim 1, wherein forming a groove in a surface of said ceramic substrate comprises incising said ceramic substrate and then firing said ceramic substrate, with said groove extending to a depth that is within a range of from ¼ to ¾ a thickness of said ceramic substrate.

11. The method according to claim 2, wherein making a ceramic substrate by stacking ceramic sheets having electrical conductors thereon results in said ceramic substrate having a recess therein, forming a groove in a surface of said ceramic substrate comprises forming said groove in a side wall adjacent said recess, and cleaving said ceramic substrate along said groove results in a support body having an electrical conductor exposed on a cleavage surface and an electrical conductor in said recess.

12. The method according to claim 1, wherein applying a bending moment to said ceramic substrate comprises bringing a cleaving tool into contact with a surface of said ceramic substrate, opposite to said surface having said groove therein, at a position corresponding to said groove.

13. The method according to claim 12, wherein cleaving said ceramic substrate further comprises moving said two stages in said opposite directions while said cleaving tool is in contact with said surface of said ceramic substrate that is opposite to said surface having said groove therein.

14. The method according to claim 13, wherein each of said two stages includes an elastic body such that bringing said cleaving tool into contact with said surface of said ceramic substrate that is opposite to said surface having said groove therein results in each said elastic body deforming.

15. The method according to claim 14, further comprising: adhesively joining said ceramic substrate to said each said elastic body via an adhesive sheet positioned between said each said elastic body and said surface of said ceramic substrate having said groove therein.

16. The method according to claim 1, wherein cleaving said ceramic substrate further comprises moving said two stages in said opposite directions while said bending moment is being applied to said ceramic substrate.

17. The method according to claim 16, wherein each of said two stages includes an elastic body such that applying said bending moment to said ceramic substrate results in each said elastic body deforming.

18. The method according to claim 17, further comprising: adhesively joining said ceramic substrate to said each said elastic body via an adhesive sheet positioned between said each said elastic body and said surface of said ceramic substrate having said groove therein.

19. The method according to claim 1, wherein each of said two stages includes an elastic body such that applying said bending moment to said ceramic substrate results in each said elastic body deforming.

20. The method according to claim 19, further comprising: adhesively joining said ceramic substrate to said each said elastic body via an adhesive sheet positioned between said each said elastic body and said surface of said ceramic substrate having said groove therein.

* * * * *